(12) United States Patent
Lesso et al.

(10) Patent No.: US 11,588,452 B2
(45) Date of Patent: Feb. 21, 2023

(54) CLASS D AMPLIFIER CIRCUITRY

(71) Applicant: Cirrus Logic International Semiconductor Ltd., Edinburgh (GB)

(72) Inventors: John P. Lesso, Edinburgh (GB); David P. Singleton, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/186,741

(22) Filed: Feb. 26, 2021

(65) Prior Publication Data
US 2022/0278658 A1  Sep. 1, 2022

(51) Int. Cl.
*H03F 3/217* (2006.01)
*H03F 1/32* (2006.01)

(52) U.S. Cl.
CPC ......... *H03F 3/2173* (2013.01); *H03F 1/3258* (2013.01); *H03F 2200/351* (2013.01)

(58) Field of Classification Search
CPC ................. H03F 3/2173; H03F 1/3258; H03F 2200/351; H03F 3/2178
USPC ....................................... 330/10, 207 A, 251
See application file for complete search history.

(56) References Cited

U.S. PATENT DOCUMENTS

| | | | |
|---|---|---|---|
| 7,768,347 B2 * | 8/2010 | De Cremoux | H03F 3/217 330/251 |
| 8,330,541 B2 * | 12/2012 | Cerutti | H03F 3/217 330/207 A |
| 9,019,008 B2 * | 4/2015 | Van Holland | H03F 3/2178 330/10 |
| 10,256,779 B2 * | 4/2019 | Polarouthu | H03F 1/0211 |
| 2008/0284511 A1 | 11/2008 | De Cremoux | |
| 2012/0223772 A1 | 9/2012 | Cerutti | |

FOREIGN PATENT DOCUMENTS

EP  2387149 A1  11/2011

OTHER PUBLICATIONS

Invitation to Pay Additional Fees, Partial International Search Report and Provisional Opinion , International Application No. PCT/GB2022/050189, dated Apr. 28, 2022.

* cited by examiner

*Primary Examiner* — Hieu P Nguyen
(74) *Attorney, Agent, or Firm* — Jackson Walker L.L.P.

(57) ABSTRACT

Class D amplifier circuitry comprising: modulator circuitry; and output stage circuitry, wherein the modulator circuitry is configured to: receive an input signal and first and second carrier signals, wherein the second carrier signal is offset in amplitude with respect to the first carrier signal; generate first and second modulated output signals, each of the first and second modulated output signals being based on the input signal and the first and second carrier signals; and generate a plurality of control signals for the output stage circuitry per signal period of the modulated output signals, wherein the plurality of control signals are based on the first and second modulated output signals, and wherein at least one of the plurality of control signals per signal period comprises a signal level transition.

26 Claims, 17 Drawing Sheets

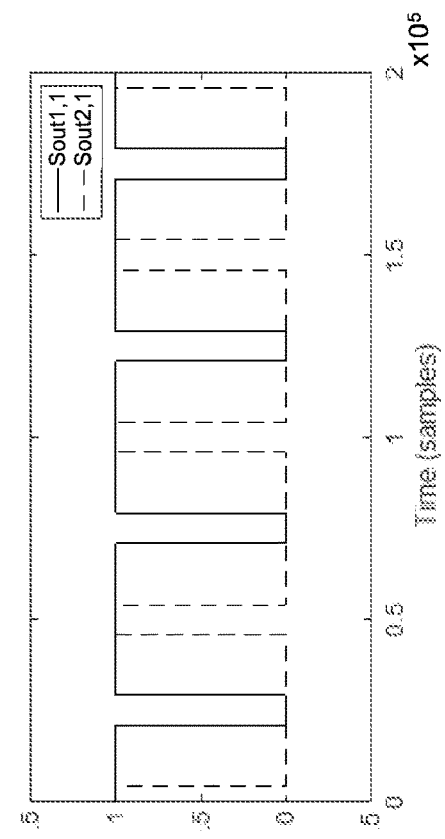
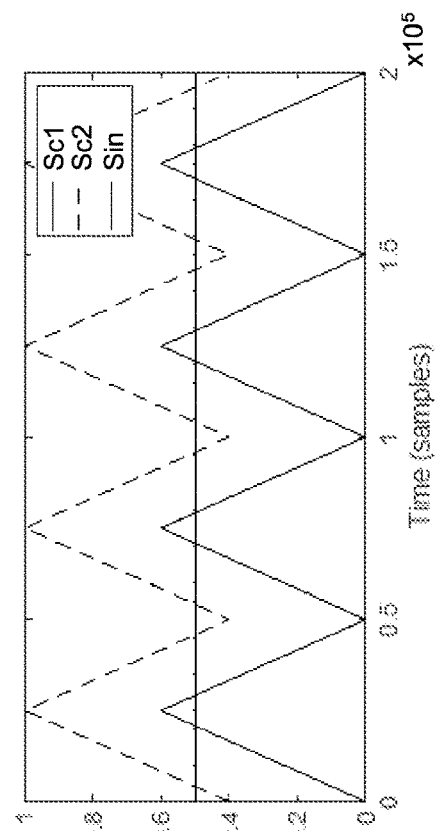
Figure 8a
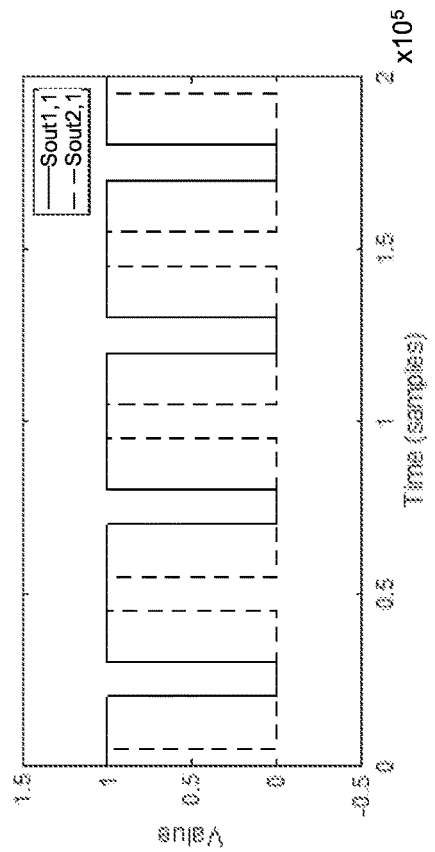
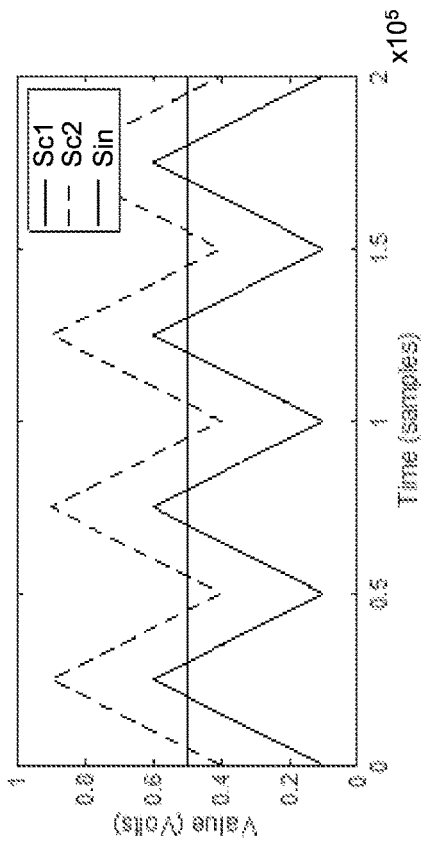
Figure 8b

CLASS D AMPLIFIER CIRCUITRY

FIELD OF THE INVENTION

The present disclosure relates to Class D amplifier circuitry, and to modulator circuitry for use in Class D amplifier circuitry or DC-DC converter circuitry.

BACKGROUND

Class D amplifiers are increasingly being used in electronic devices for which power efficiency is important, such as mobile telephones, portable media players, laptop and tablet computers and wireless headphones, earphones and earbuds.

A typical Class D amplifier is shown generally at 100 in FIG. 1, and includes a modulator stage 110 and an output stage 150.

The modulator stage 110 in the illustrated example includes first comparator circuitry 112, second comparator circuitry 114, carrier signal generator circuitry 116 and inverter circuitry 118.

A non-inverting (+) input terminal of the first comparator circuitry 112 is coupled to an input terminal 120 of the modulator stage 110, which receives an input signal Sin. Thus the first comparator circuitry 112 is configured to receive the input signal Sin at its non-inverting input terminal.

An input of the inverter circuitry 118 is coupled to the input terminal 120 so as to receive the input signal Sin. An output of the inverter circuitry 118 is coupled to a non-inverting (+) input terminal of the second comparator 114. Thus the second comparator circuitry 114 is configured to receive, at its non-inverting input terminal, a version $\overline{\text{Sin}}$ of the input signal Sin that has been inverted with respect to a quiescent reference signal (e.g. 0V). The inverted version $\overline{\text{Sin}}$ of the input signal Sin is thus complementary to the input signal Sin.

The carrier signal generator circuitry 116 is configured to generate a cyclical carrier signal Sc which may be, for example, a triangle wave or sawtooth wave voltage signal. The carrier signal Sc typically has a frequency that is several times greater than the bandwidth of the input signal Sin (e.g. audio applications the frequency of the carrier signal Sc may be of the order of 300 kHz), and a peak-to-peak amplitude that is equal to or greater than the peak-to-peak amplitude of the input signal Sin.

An output of the carrier signal generator circuitry 116 is coupled to the inverting (−) inputs of the first and second comparator circuitry 112, 114. Thus the first and second comparator circuitry 112, 114 are configured to receive the carrier signal Sc at their inverting inputs.

The first comparator circuitry 112 is configured to compare the input signal Sin to the carrier signal Sc and to output a first modulated output signal PWM1 based on the comparison. In the illustrated example, if an instantaneous level (e.g. amplitude) of the input signal Sin is equal to or greater than an instantaneous level (e.g. amplitude) of the carrier signal Sc the first modulated output signal PWM1 takes a high (e.g. logic 1) value, whereas if the instantaneous level of the input signal Sin is less than the instantaneous level of the carrier signal Sc the first modulated output signal PWM1 takes a low (e.g. logic 0) value. Thus, the first modulated output signal PWM1 is a pulse width modulated (PWM) signal, in which the width of the pulses represents the input signal Sin.

The second comparator circuitry 114 is similarly configured to compare the inverted version $\overline{\text{Sin}}$ of the input signal Sin to the carrier signal Sc and to output a second PWM modulated output signal PWM2 based on the comparison.

The output stage 150 in the illustrated example is a full-bridge output stage comprising a first half-bridge 160 and a second half-bridge 170, which together provide a differential output voltage Vout for driving a bridge-tied load 180 (e.g. a loudspeaker) that can be coupled between output nodes 162, 172 of the first and second half-bridges 160, 170 respectively.

The first half-bridge 160 comprises a high-side switch 164 coupled in series with a complementary low-side switch 166 between a first supply voltage (VDD) rail 192 and a reference voltage (e.g. ground) rail 194 of the output stage 150. The high-side switch 164 and the low-side switch 168 may be, for example, complementary MOSFET devices.

Control terminals (e.g. gate terminals) of the high-side and low-side switches 164, 166 are coupled to an input node 168 of the first half-bridge 160. The input node 168 is coupled to an output terminal of the first comparator circuitry 112, such that the first modulated output signal PWM1 is received at the control terminals of the high-side and low-side switches 164, 166.

As the high-side switch 164 and the low-side switch 166 are complementary, when the high-side switch 164 is switched on in response to the first modulated signal PWM1 at its control terminal, the low-side switch 166 is switched off, and vice versa. Thus, in operation of the first half-bridge 160, the output node 162 will be at either the first supply voltage (VDD) or the reference voltage (e.g. ground), depending upon whether the high-side switch 164 or the low-side switch 166 is switched on.

Similarly, the second half-bridge 170 comprises a high-side switch 174 coupled in series with a complementary low-side switch 176 between the first supply voltage (VDD) rail 192 and the reference voltage (e.g. ground) rail 194 of the output stage 150. Again, the high-side switch 174 and the low-side switch 176 may be, for example, complementary MOSFET devices.

Control terminals (e.g. gate terminals) of the high-side and low-side switches 174, 176 are coupled to an input node 178 of the second half-bridge 170. The input node 178 is coupled to an output terminal of second comparator circuitry 114, such that the second modulated output signal PWM2 is received at the control terminals of the high-side and low-side switches 174, 176.

Again, as the high-side switch 174 and the low-side switch 176 are complementary, when the high-side switch 174 is switched on in response to the second modulated signal PWM2 at its control terminal, the low-side switch 176 is switched off, and vice versa. Thus, in operation of the second half-bridge 170, the output node 172 will be at either the first supply voltage (VDD) or the reference voltage (e.g. ground), depending upon whether the high-side switch 174 or the low-side switch 176 is switched on.

The operation of the Class D amplifier circuitry 100 will now be described with reference to FIG. 2. The uppermost trace 202 of FIG. 2 shows an example of the first modulated output signal PWM1 output by the first comparator circuitry 112, whilst the middle trace 204 shows an example of the second modulated output signal PWM2 output by the second comparator circuitry 114. As can be seen from these traces, the first and second modulated output signals PWM1, PWM2 are complementary to one another (i.e. when one of the modulated output signals PWM1, PWM2 is high (level 1) the other is low (level 0), as a result of the inverting effect of the inverter circuitry 118.

Because of the complementary nature of the first and second modulated output signals PWM1, PWM2, in the example output stage circuitry 150 of FIG. 1 the high-side switch 174 of the second half-bridge 170 is always switched in anti-phase to the high-side switch 164 of the first half-bridge 160. Thus, when the high-side switch 164 of the first half-bridge 160 is switched on, the high-side switch 174 of the second half-bridge 170 is switched off, and vice versa.

When the high-side switch 164 of the first half-bridge 160 is switched on, the low-side switch 166 is switched off and a low-impedance current path exists between the supply voltage rail 192 and the output node 162 of the first half-bridge 160, such that a voltage equal to (or close to) +VDD develops at the output node 162. The low-side switch 176 of the second half-bridge 170 is switched on (and the high-side switch 174 is switched off), so current can flow from left to right through the load 180 to the reference (ground) supply rail 194. Thus the voltage Vout across the load 180 when the high-side switch 164 of the first output stage 160 is switched on is equal to (or close to) +VDD.

When the high-side switch 174 of the second half-bridge 170 is switched on, the low-side switch 176 is switched off and a low-impedance current path exists between the supply voltage rail 192 and the output node 172 of the second half-bridge 170, such that a voltage equal to (or close to) +VDD develops at the output node 172. The low-side switch 166 of the first half-bridge 160 is switched on (and the high-side switch 164 is switched off), so current can flow from right to left through the load 180 to the reference (ground) supply rail 194. Thus the voltage Vout across the load 180 when the high-side switch 174 of the second output stage 170 is switched on is equal to (or close to) −VDD.

Thus in operation of the Class D amplifier circuitry 100 of FIG. 1, the output voltage Vout across the load can be either +VDD or −VDD, as shown in the lowermost trace 206 of FIG. 2.

The Class D amplifier 100 is relatively power efficient, because the switches of the output stage 150 do not conduct current and thus do not dissipate power when they are switched off, and the voltage drop across them when they are switched on is low, such that power dissipation is low when the switches are switched on. However, the switches of the output stage always switch the output nodes 162, 172 between VDD and 0V, even at low input signal (Sin) levels at which the full supply voltage VDD is not required at the output nodes 162, 172. In such circumstances capacitive ($CV^2/2$) losses in the switches may be unnecessarily high due to the unnecessarily high voltage (VDD) being switched.

FIG. 3 is a schematic representation of an alternative output stage 300 for a Class D amplifier. The output stage 300 is based on the output stage 150 described above with reference to FIG. 1, and so elements that are common to the output stage 150 of FIG. 1 and the output stage 300 of FIG. 3 are denoted by common reference numerals and will not be described again here.

The output stage 300 differs from the output stage 150 in that the switches 164, 166 and 174, 176 are coupled in series between a first supply voltage (VDD1) rail 310 and a reference voltage (e.g. ground) rail 320.

The output stage 300 further differs from the output stage in that its first half-bridge 360 includes a second high-side switch 364, coupled between a second supply voltage (VDD2) rail 330 and the output node 162, and in that its second half-bridge 370 also includes a second high-side switch 374, coupled between the second supply voltage (VDD2) rail 330 and the output node 172. The second supply voltage VDD2 in this example is of smaller magnitude than the first supply voltage VDD1. For example, VDD2 may be equal to VDD1/2.

The input node 168 of the first half-bridge 160 is coupled to an output terminal of the first comparator circuitry 112, such that the first modulated output signal PWM1 can be received at the control terminal of the high-side switch 164 (and at the control terminal of the low-side switch 164, though for clarity the connection between the input node 168 and the control terminal of the low-side switch 164 is not shown). However, in the circuitry 300 of FIG. 3, the first modulated output signal PWM1 is only received at the input node 168 if a parameter (e.g. a signal level, envelope or volume) of the input signal Sin is equal to or greater than a threshold Th.

A control terminal (e.g. a gate terminal) of the second high-side switch 364 is coupled to a second input node 368 of the first half-bridge 360. The second input node 368 is also coupled to the output terminal of the first comparator circuitry 112, such that the first modulated output signal PWM1 can be received at the control terminal of the second high-side switch 364 (and at the control terminal of the low-side switch 164, though for clarity the connection between the second input node 368 and the control terminal of the low-side switch 164 is not shown). The first modulated output signal PWM1 is only received at the second input node 368 if a parameter (e.g. a signal level, envelope or volume) of the input signal Sin is less than the threshold Th.

Thus, when the input signal Sin parameter is equal to or greater than the threshold Th, the output node 162 will be at either the first supply voltage (VDD1) or the reference voltage (e.g. ground), depending upon whether the high-side switch 164 or the low-side switch 166 is switched on. When the input signal Sin parameter is less than the threshold Th, the output node 162 will be at either the second supply voltage (VDD2) or the reference voltage (e.g. ground), depending upon whether the second high-side switch 364 or the low-side switch 166 is switched on.

Similarly, the input node 178 of the second half-bridge 370 is coupled to an output terminal of the second comparator circuitry 114, such that the second modulated output signal PWM2 can be received at the control terminal of the high-side switch 174 (and at the control terminal of the low-side switch 174, though for clarity the connection between the input node 178 and the control terminal of the low-side switch 174 is not shown). However, in the circuitry 300 of FIG. 2, the second modulated output signal PWM2 is only received at the input node 178 if a parameter (e.g. a signal level, envelope or volume) of the input signal Sin is equal to or greater than a threshold Th.

A control terminals (e.g. a gate terminal) of the second high-side switch 374 is coupled to a second input node 378 of the second half-bridge 370. The second input node 378 is also coupled to the output terminal of the second comparator circuitry 114, such that the second modulated output signal PWM2 can be received at the control terminal of the second high-side switch 374 (and at the control terminal of the low-side switch 174, though for clarity the connection between the second input node 378 and the control terminal of the low-side switch 164 is not shown). The second modulated output signal PWM2 is only received at the second input node 378 if a parameter (e.g. a signal level, envelope or volume) of the input signal Sin is less than the threshold Th.

Thus, when the input signal Sin parameter is equal to or greater than the threshold Th, the output node 172 will be at either the first supply voltage (VDD1) or the reference voltage (e.g. ground), depending upon whether the high-side switch 174 or the low-side switch 176 is switched on. When the input signal Sin parameter is less than the threshold Th, the output node 172 will be at either the second supply voltage (VDD2) or the reference voltage (e.g. ground), depending upon whether the second high-side switch 374 or the low-side switch 176 is switched on.

Thus the differential output voltage Vout across the load 180 in the output stage 300 can be either +VDD1, +VDD2, −VDD1 or −VDD2.

However, the output stage 300 can give rise to artefacts in a signal output by the load 180 in response to the output voltage Vout (e.g. audible artefacts, where the load 180 is a loudspeaker or the like) if there is any mismatch between the common mode voltages of the two half-bridges 360, 370, which may arise, for example, due to a difference in the timing of switching the modulated output signals from the high-side switches 164, 174 to the second high-side switches 364, 374.

SUMMARY

According to a first aspect, the invention provides Class D amplifier circuitry comprising:
modulator circuitry; and
output stage circuitry,
wherein the modulator circuitry is configured to:
receive an input signal and first and second carrier signals, wherein the second carrier signal is offset in amplitude with respect to the first carrier signal;
generate first and second modulated output signals, each of the first and second modulated output signals being based on the input signal and the first and second carrier signals; and
generate a plurality of control signals for the output stage circuitry per signal period of the modulated output signals, wherein the plurality of control signals are based on the first and second modulated output signals, and wherein at least one of the plurality of control signals per signal period comprises a signal level transition.

An amplitude range of the first carrier signal and an amplitude range of the second carrier signal may partially overlap such that at least one of the first and second modulated output signals comprises at least one signal level transition per signal period.

The first and second carrier signals may be configured such that a combined amplitude range of the first and second carrier signals is equal to or greater than an expected full-scale amplitude range of the input signal.

The Class D amplifier circuitry may further comprise compensation circuitry configured to compensate, at least partially, for distortion in an output signal of the Class D amplifier circuitry that arises as a result of the overlap in the amplitude ranges of the first and second carrier signals.

The compensation circuitry may be configured to modify the first and second carrier signals.

The modulator circuitry may comprise digital carrier signal generator circuitry, and the compensation circuitry may comprise processing circuitry configured to adjust a value of the first and second carrier signals in a region of overlap of the first and second carrier signals.

The compensation circuitry may comprise a lookup table containing predefined adjusted values for the first and second carrier signals in the region of overlap.

The modulator may comprise up/down counter circuitry configured to count from a first predetermined count value to a second predetermined count value and from the second predetermined count value to the first predetermined count value in synchronisation with a clock signal.

The compensation circuitry may be configured to modify the input signal.

The compensation circuitry may comprises predistortion circuitry configured to apply a compensation function to modify the input signal and to output a modified version of the input signal for use in generating the first and second modulated output signals.

The compensation function may comprise one or more of:
a polynomial transfer function;
a machine learning function; and
an input signal level dependent compensation function.

The compensation function may comprise a first fixed gain for input signal levels within a region of overlap of the first and second carrier signals and a second fixed gain for input signal levels outside the region of overlap.

The compensation function may comprise a fixed gain for input signal levels within a region of overlap of the first and second carrier signals and a polynomial transfer function or machine learning function for input signal levels outside the region of overlap.

The Class D amplifier circuitry may further comprise a feedback loop operative to feed a portion of a modulated output signal output by the modulator circuitry to an input of the predistortion circuitry.

The modulator circuitry may be operable in:
a multi-carrier mode in which the first and second carrier signals are used to generate the first and second modulated output signals; and
a single-carrier mode in which a single carrier signal is used to generated the first and second modulated output signals.

The Class D amplifier circuitry may further comprise signal monitor circuitry configured to monitor a parameter of the input signal and to output a mode control signal to control the operating mode of the modulator circuitry based on the monitored parameter of the input signal.

The monitored parameter may comprise one or more of an envelope, a signal level or a signal volume of the input signal.

The amplitude ranges of the first and second carrier signals may overlap by up to ten per cent of a peak-to-peak amplitude of the first and second carrier signals.

The modulator circuitry may be configured to insert a signal level transition into the at least one of the plurality of control signals if, for a corresponding period of the first and second modulated output signals, neither the first modulated output signal nor the second modulated output signal contains a signal level transition.

According to a second aspect, the invention provides Class D amplifier circuitry comprising:
modulator circuitry operable in a single carrier operating mode and a multi-carrier operating mode, the modulator circuitry being configured to receive an input signal and to output a modulated output signal based on the input signal; and
signal monitor circuitry operative to monitor a parameter of the input signal and to output a mode control signal to control the operating mode of the modulator circuitry based on the monitored parameter of the input signal.

According to a third aspect, the invention provides pulse width modulator circuitry comprising:

first modulated signal generator circuitry configured to receive first and second carrier signals and a first modulating signal derived from an input signal and to generate a first pulse width modulated output signal based on the first and second carrier signals and the first modulating signal; and second modulated signal generator circuitry configured to receive the first and second carrier signals and a second modulating signal derived from the input signal and to generate a second pulse width modulated output signal based on the first and second carrier signals and the second modulating signal, wherein the second carrier signal is offset in amplitude with respect to the first carrier signal, and wherein an amplitude range of the first carrier signal and an amplitude range of the second carrier signal partially overlap.

According to a fourth aspect, the invention provides DC-DC converter circuitry comprising:

modulator circuitry configured to:

receive an input signal and first and second carrier signals, wherein the second carrier signal is offset in amplitude with respect to the first carrier signal;

generate first and second modulated output signals, each of the first and second modulated output signals being based on the input signal and the first and second carrier signals; and generate a plurality of control signals per signal period of the modulated output signals, wherein the plurality of control signals are based on the first and second modulated output signals, and wherein at least one of the plurality of control signals per signal period comprises a signal level transition.

According to a fifth aspect, the invention provides Class D amplifier circuitry comprising:

modulator circuitry configured to:

receive an input signal and first and second carrier signals, wherein the second carrier signal is offset in amplitude with respect to the first carrier signal; and generate first and second modulated output signals, wherein the first modulated output signal is based on the input signal and the first carrier signal and the second modulated output signal is based on the input signal and the second carrier signal, generate a plurality of control signals for the output stage circuitry per signal period of the modulated output signals, wherein the plurality of control signals are based on the first and second modulated output signals, and wherein at least one of the plurality of control signals per signal period comprises a signal level transition.

According to a sixth aspect, the invention provides an integrated circuit comprising circuitry according to any of the first to fourth aspects.

According to a seventh aspect, the invention provides electronic device comprising circuitry according to any of the first to fourth aspects.

The electronic device may comprise a mobile telephone, a tablet or laptop computer, a wearable device, a gaming device, a virtual reality or augmented reality device.

BRIEF DESCRIPTION OF THE DRAWINGS

Embodiments of the invention will now be described, strictly by way of example only, with reference to the accompanying drawings, of which:

FIGS. 8a and 8b illustrate example offset carrier signals with partially overlapping amplitude ranges and the effect of such carrier signals on the modulation index of modulated signals;

DETAILED DESCRIPTION

Figure 3:
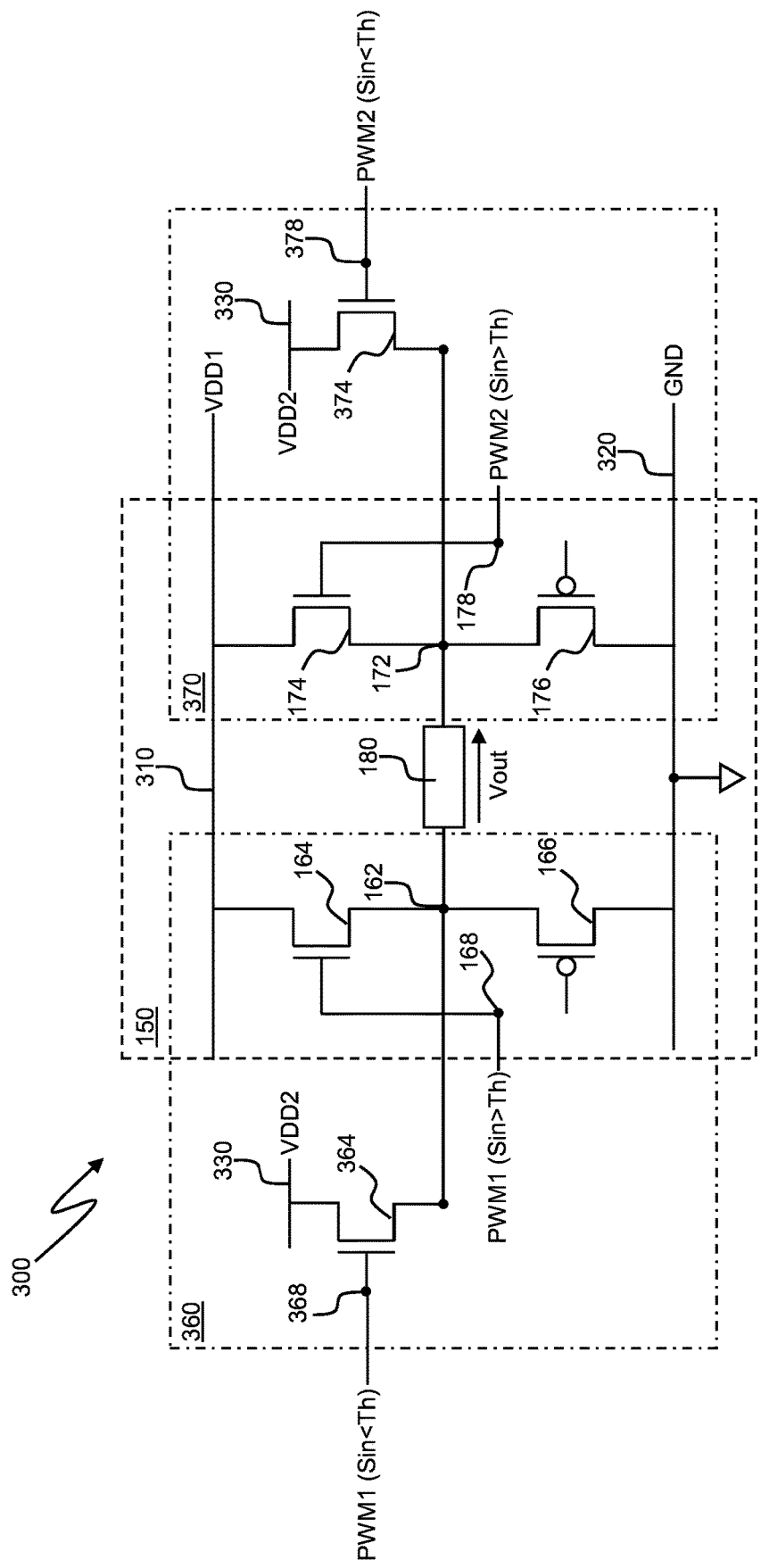
FIG. 3 is a schematic diagram illustrating an alternative output stage for Class D amplifier circuitry.
Figure 4:
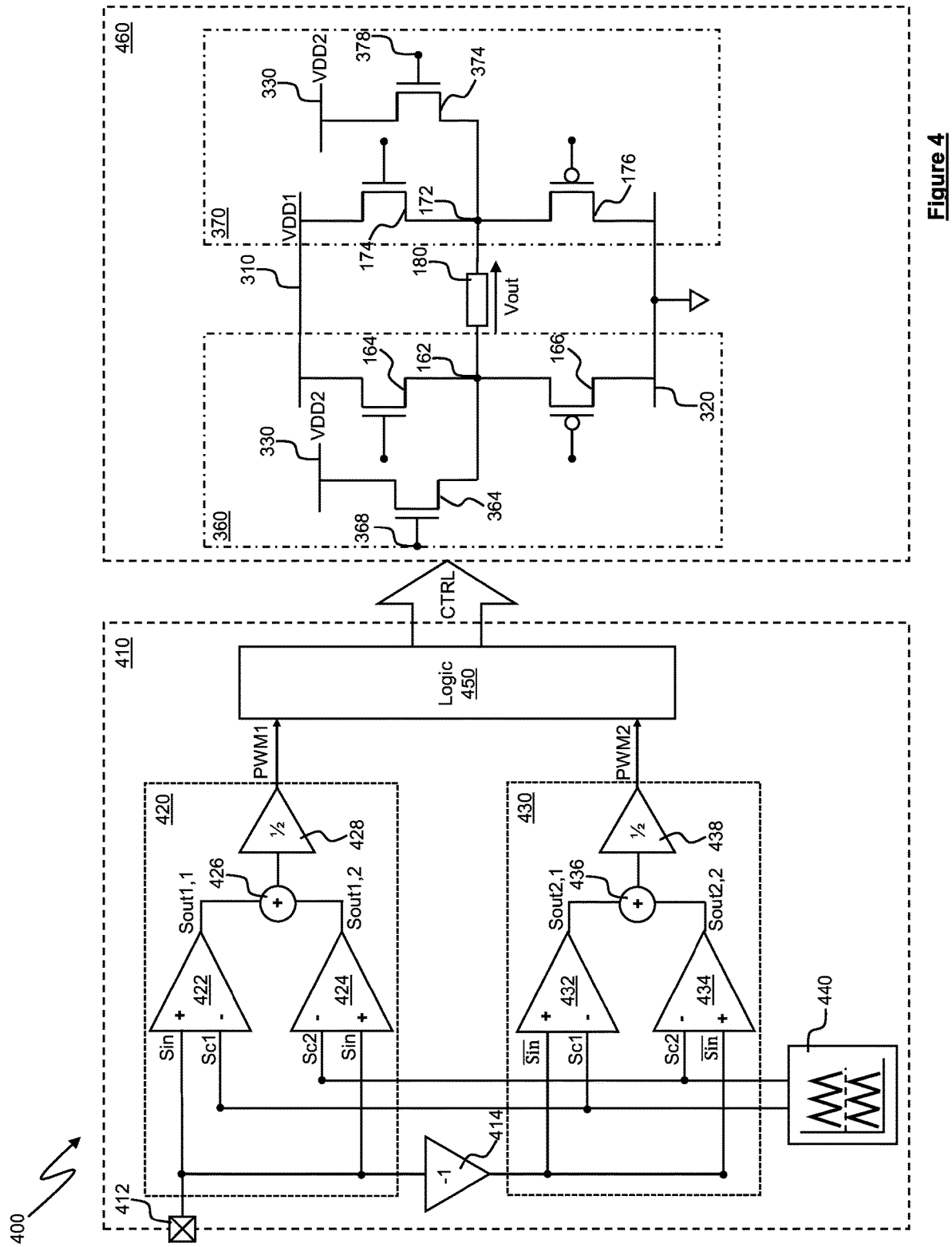
FIG. 4 is a schematic diagram illustrating Class D amplifier circuitry according to the present disclosure.

Referring first to FIG. 4, Class D amplifier circuitry is shown generally at 400, and comprises a modulator stage 410 and an output stage 460. The output stage 460 shares some features in common with the output stage 300 described above with reference to FIG. 3. Such common features are denoted by common reference numerals in FIGS. 3 and 4.

The modulator stage 410 in the illustrated example includes first modulated signal generator circuitry 420 configured to generate a first modulated output signal PWM1, second modulated signal generator circuitry 430 configured to generate a second modulated output signal PWM2, carrier signal generator circuitry 440 and logic circuitry 450.

An input signal Sin is received at an input terminal 412 of the modulator stage 410, and is transmitted to the first modulated signal generator circuitry 420, where it is used as a first modulating signal, and to an input of inverter circuitry 414. An output of the inverter circuitry 414 is coupled to an input of the second modulated signal generator circuitry 430 so as to output a version $\overline{\text{Sin}}$ of the input signal Sin that has been inverted with respect to a quiescent reference signal (e.g. 0V). The inverted version $\overline{\text{Sin}}$ of the input signal Sin is thus complementary to the input signal Sin, and is used as a second modulating signal by the second modulated signal generator circuitry 430.

The first modulated signal generator circuitry 420 in the illustrated example includes first comparator circuitry 422, second comparator circuitry 424, a summing node 426 coupled to outputs of the first and second comparator circuitry 422, 424 and amplifier circuitry 428 coupled an output of the summing node 426.

Similarly, the second modulated signal generator circuitry 430 in the illustrated example includes first comparator circuitry 432, second comparator circuitry 434, a summing node 436 coupled to outputs of the first and second comparator circuitry 432, 434 and amplifier circuitry 438 coupled an output of the summing node 436.

The carrier signal generator circuitry 440 of the modulator stage 410 is configured to generate a plurality (in this example two, i.e. a first and a second) of cyclical carrier signals Sc1, Sc2. The first and second carrier signals Sc1, Sc2 may be, for example, triangle or sawtooth wave voltage signals.

A first output of the carrier signal generator circuitry 440 is coupled to the inverting (−) input of the first comparator circuitry 422 of the first modulated signal generator circuitry 420 and to the inverting (−) input of the first comparator circuitry 432 of the second modulated signal generator circuitry 430, such that the first comparator circuitry 422, 432 of the first and second modulated signal generator circuitry 420, 430 each receive the first carrier signal Sc1.

A second output of the carrier signal generator circuitry 440 is coupled to the inverting (−) input of the second comparator circuitry 424 of the first modulated signal generator circuitry 420 and to the inverting (−) input of the second comparator circuitry 434 of the second modulated signal generator circuitry 430, such that the second comparator circuitry 424, 434 of the first and second modulated signal generator circuitry 420, 430 each receive the second carrier signal Sc2.

The input signal Sin is received at the non-inverting (+) inputs of the first and second comparator circuitry 422, 424 of the first modulated output signal generator circuitry 420.

Thus, the first comparator circuitry 422 is operative to compare the input signal Sin to the first carrier signal Sc1, and to output a first comparator output signal Sout1,1 based on the comparison. In the illustrated example, if an instantaneous level (e.g. amplitude) of the input signal Sin is equal to or greater than an instantaneous level (e.g. amplitude) of the first carrier signal Sc1 the first comparator output signal Sout1,1 takes a high (e.g. +1V) value, whereas if the instantaneous level of the input signal Sin is less than the instantaneous level of the first carrier signal Sc1 the first comparator output signal Sout1,1 takes a low (e.g. 0V) value. Thus the first comparator output signal Sout1,1 is a first pulse width modulated signal representative of the input signal Sin, and is based on the input signal Sin and the first carrier signal Sc1.

The second comparator circuitry 424 is operative to compare the input signal Sin to the second carrier signal Sc2, and to output a second comparator output signal Sout1,2 based on the comparison. In the illustrated example, if an instantaneous level (e.g. amplitude) of the input signal Sin is equal to or greater than an instantaneous level (e.g. amplitude) of the second carrier signal Sc2 the second comparator output signal Sout1,2 takes a high (e.g. +1V) value, whereas if the instantaneous level of the input signal Sin is less than the instantaneous level of the second carrier signal Sc2 the second comparator output signal Sout1,2 takes a low (e.g. 0V) value. Thus the second comparator output signal Sout1,2 is a second pulse width modulated signal representative of the input signal Sin, and is based on the input signal Sin and the second carrier signal Sc2.

The summing node 426 of the first modulated output signal generator circuitry 420 sums the first and second comparator output signals Sout1,1, Sout1,2 and outputs the sum to the amplifier circuitry 428, which applies a gain of ½ to the sum output by the summing node 426, to generate a first modulated output signal PWM1 that is representative of the input signal Sin.

The inverted version $\overline{\text{Sin}}$ of the input signal is received at the non-inverting (+) inputs of the first and second comparator circuitry 432, 434 of the second modulated output signal generator circuitry 430.

Thus, the first comparator circuitry 432 is operative to compare the inverted version $\overline{\text{Sin}}$ of the input signal Sin to the first carrier signal Sc1, and to output a first comparator output signal Sout2,1 based on the comparison. In the illustrated example, if an instantaneous level (e.g. amplitude) of the signal $\overline{\text{Sin}}$ is equal to or greater than an instantaneous level (e.g. amplitude) of the first carrier signal Sc1 the first comparator output signal Sout2,1 takes a high (e.g. +1V) value, whereas if the instantaneous level of the signal $\overline{\text{Sin}}$ is less than the instantaneous level of the first carrier signal Sc1 the first comparator output signal Sout2,1 takes a low (e.g. 0V) value. Thus the first comparator output signal Sout2,1 is a first pulse width modulated signal representative of the input signal Sin, and is based on the input signal Sin and the first carrier signal Sc1.

The second comparator circuitry 434 is operative to compare the inverted version $\overline{\text{Sin}}$ of the input signal Sin to the second carrier signal Sc2, and to output a second comparator output signal Sout2,2 based on the comparison. In the illustrated example, if an instantaneous level (e.g. amplitude) of the signal $\overline{\text{Sin}}$ is equal to or greater than an instantaneous level (e.g. amplitude) of the second carrier signal Sc2 the second comparator output signal Sout2,2 takes a high (e.g. +1V) value, whereas if the instantaneous level of the signal $\overline{\text{Sin}}$ is less than the instantaneous level of the second carrier signal Sc2 the second comparator output signal Sout2,2 takes a low (e.g. 0V) value. Thus the second comparator output signal Sout2,2 is a second pulse width modulated signal representative of the input signal Sin, and is based on the input signal Sin and the second carrier signal Sc2.

The summing node 436 of the second modulated output signal generator circuitry 430 sums the first and second comparator output signals Sout2,1, Sout2,2 and outputs the sum to the amplifier circuitry 438, which applies a gain of ½ to the sum output by the summing node 436, to generate a second modulated output signal PWM2 that is representative of the input signal Sin.

In the illustrated example, the first and second modulated output signals PWM1, PWM2 are received by the logic circuitry 450, which generates control signals CTRL for the switches 164, 166, 364, 174, 176, 374 of the output stage 460 based on the first and second modulated output signals PWM1, PWM2. The control circuitry generates a plurality of control signals (one control signal for each of the switches 164, 166, 364, 174, 176, 374) per signal period or cycle of the modulated output signals PWM1, PWM2. (As will be apparent from the discussion below, the first and second carrier signals Sc1, Sc2 are equal in frequency, and thus the frequency and signal period of the first and second modulated output signals PWM1, PWM2 are also equal).

In an alternative example the summing nodes 426, 436 and the amplifier circuitry 428, 438 may be omitted, and the comparator output signals Sout1,1, Sout1,2, Sout2,1, Sout2,2 may be output directly to the logic circuitry 450. The logic circuitry may generate the control signals CTRL for the switches 164, 166, 364, 174, 176, 374 of the output stage 460 based on the modulated comparator output signals Sout1,1, Sout1,2, Sout2,1, Sout2,2. Alternatively, the first and second modulated signals PWM1, PWM2 may be generated in the logic circuitry 450 and used to generate the control signals CTRL.

The output stage 460 in the illustrated example is similar in some respects to the output stage 300 of FIG. 3.

The output stage 460 comprises a first half-bridge 360 comprising a first high-side switch 164 and a first low-side switch 166 coupled in series between a first supply (VDD1) rail 310 and a reference voltage (e.g. ground) rail 320, and a second high-side switch 364, coupled between a second supply voltage (VDD2) rail 330 and an output node 162.

The output stage 460 further comprises a second half-bridge 370 comprising a first high-side switch 174 and a first low-side switch 176 coupled in series between the first supply (VDD1) rail 310 and the reference voltage (e.g. ground) rail 320, and a second high-side switch 374, coupled between the second supply voltage (VDD2) rail 330 and an output node 172.

The output stage 460 differs from the output stage 300 in that the control (e.g. gate) terminals of the switches 164, 166, 364, 174, 176, 374 are coupled to the logic circuitry 450, such that in every period or cycle of the modulated output signals PWM1, PWM2, each of the switches 164, 166, 364, 174, 176, 374 receives an individual control signal from the logic circuitry 450 to control its operation, as will be explained in more detail below.

Figure 5:
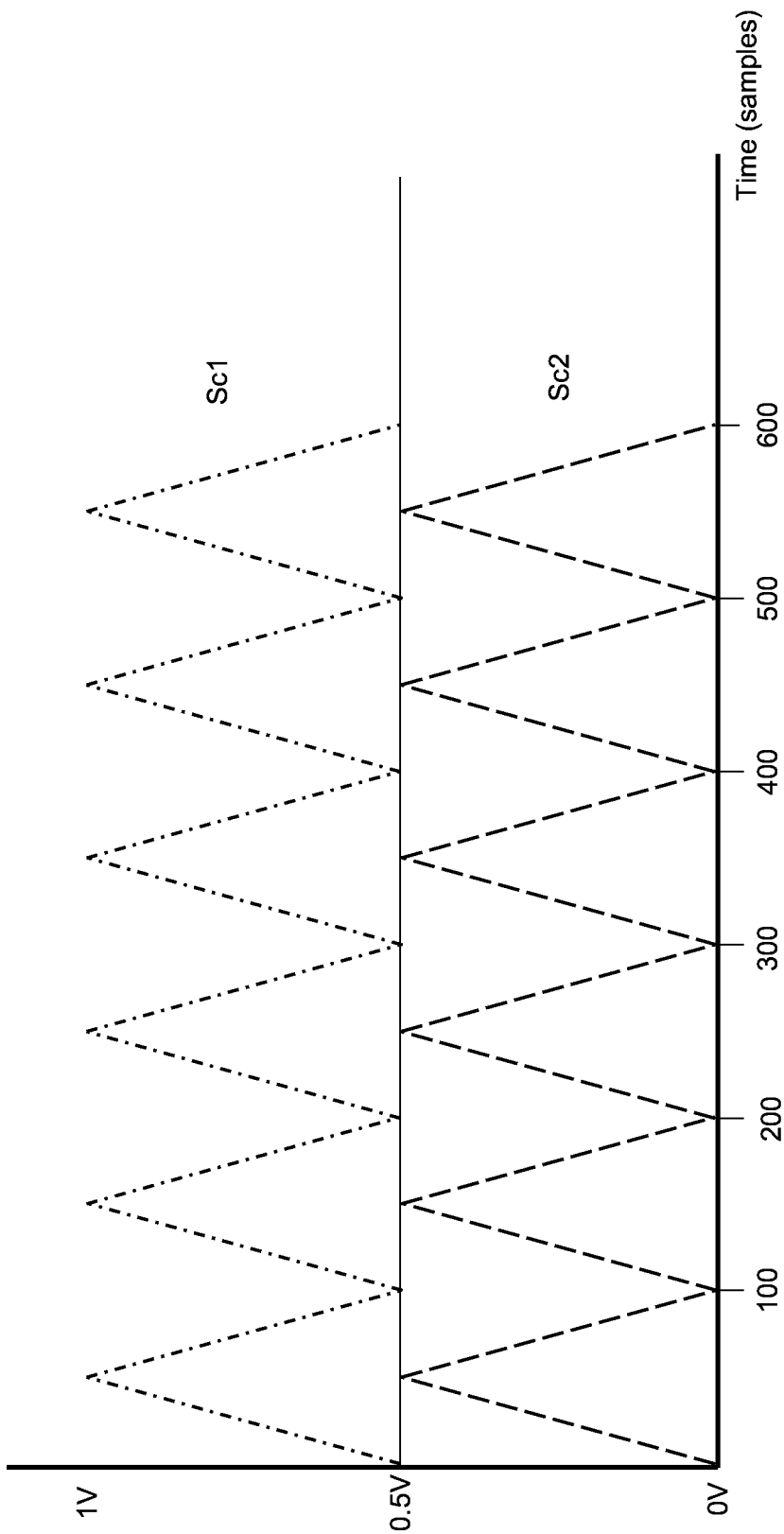
FIG. 5 illustrates example offset carrier signals used in a modulator stage of the Class D amplifier circuitry of FIG. 4.

FIG. 5 illustrates example first and second carrier signals Sc1, Sc2 that may be output by the carrier signal generator circuitry 440. In the illustrated example the first and second carrier signals Sc1, Sc2 are triangle wave signals. As shown in FIG. 5, the first and second carrier signals Sc1, Sc2 are equal in frequency and peak-to-peak amplitude and are aligned in time. However, the second carrier signal S 2 is level shifted (i.e. offset in amplitude) with respect to the first carrier signal Sc1. In the example illustrated in FIG. 5, the amplitude of the first carrier signal Sc1 varies between 0 volts and 0.5 volts, whereas the amplitude of the second carrier signal Sc2 varies between 0.5 volts and 1 volt. Thus the peak-to-peak amplitude (0.5V) of the first carrier signal Sc1 is equal to the peak-to-peak amplitude (0.5V) of the second carrier signal Sc2, but there is a constant amplitude offset or level shift of 0.5 volts between the first and second carrier signals Sc1, Sc2. The combined peak-to-peak amplitude of the first and second carrier signals Sc1, Sc2 (which is equal to 1 volt in the example of FIG. 5) is equal to or greater than the expected peak-to-peak amplitude of the input signal Sin.

As explained above, the first and second modulated output signal generator circuitry 420, 430 of the Class D amplifier circuitry 400 of FIG. 4 each generate a respective modulated output signal PWM1, PWM2 based on the modulated comparator output signals output by the comparator circuitry 422, 424, 432, 434.

Figure 6:
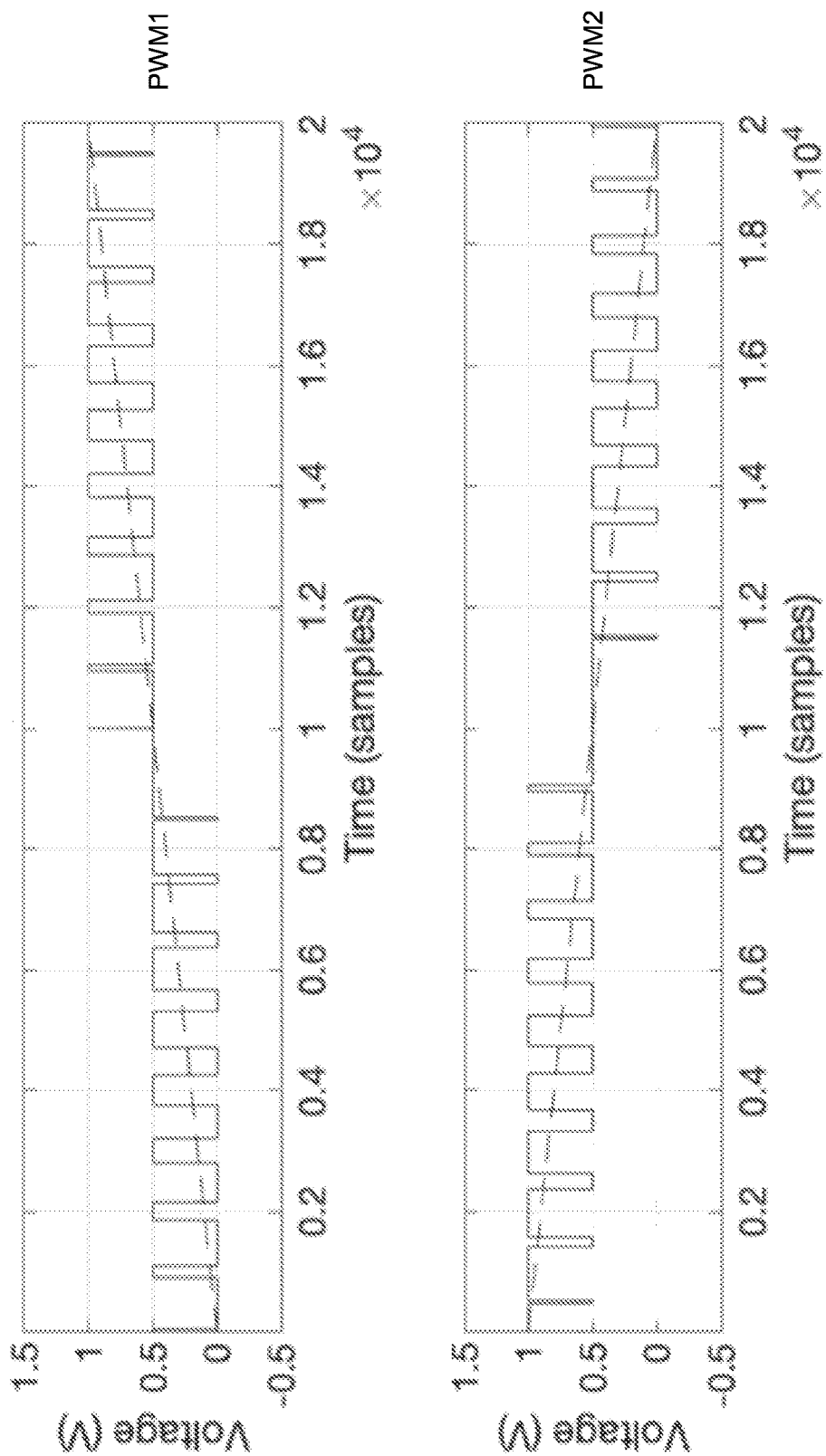
FIG. 6 illustrates example first and second modulated output signals output by the modulator stage of the amplifier circuitry of FIG. 4.

FIG. 6 shows example modulated output signals PWM1, PWM2 generated by the first and second modulated output signal generator circuitry 420, 430 using the first and second carrier signals Sc1, Sc2 of FIG. 5. For the sake of simplicity and clarity FIG. 6 shows the input signal Sin as a ramp signal, but it will be appreciated by those of ordinary skill in the art that the input signal Sin will typically take some other form, e.g. an audio signal.

As can be seen from FIG. 6, the first and second modulated output signals PWM1, PWM2 can each take one of three values, in this example 0V, 0.5V or 1V.

The logic circuitry 450 is configured to output control signals for the switches 164, 166, 364 of the first half-bridge 360 based on the first modulated output signal PWM1, and to output control signals for the switches 174, 176, 374 of the second half-bridge 370 based on the second modulated output signal PWM2.

Thus, in contrast to the example shown in FIG. 3, the switches 164, 166, 364, 174, 176, 374 are controlled by the modulator stage 410 (based on the modulated output signals PWM1, PWM2) rather than by external circuitry that compares a parameter of the input signal Sin to a threshold to determine which of the switches 164, 166, 364, 174, 176, 374 should be closed. Thus the issue of mismatch between the common mode voltages between the two half-bridges 360, 370 and the resulting audible artefacts associated with the amplifier circuitry described above with reference to FIG. 3 is alleviated in the amplifier circuitry 400 of FIG. 4.

In the illustrated example the logic circuitry 450 is configured to output a control signal to cause switch 164 to close when the value of the first modulated output signal PWM1 is 1V, to output a control signal to cause switch 364 to close when the value of the first modulated output signal PWM1 is 0.5V, and to output a control signal to cause switch 166 to close when the value of the first modulated output signal PWM1 is 0V.

Similarly, the logic circuitry 450 is configured to output a control signal to cause switch 174 to close when the value of the second modulated output signal PWM2 is 1V, to output a control signal to cause switch 374 to close when the value of the second modulated output signal PWM2 is 0.5V, and to output a control signal to cause switch 176 to close when the value of the second modulated output signal PWM2 is 0V.

Thus, the voltage at the output node 162 will be either VDD1, VDD2 or 0V, depending on the value of the first modulated output signal PWM1. Similarly, the voltage at the output node 172 will be either VDD1, VDD2 or 0V, depending upon the value of the second modulated output signal PWM2. For example, if VDD1 is equal to VDD, and VDD2 is equal to VDD/2, the voltage Vout across the load 180 can take one of five values, as shown in Table 1 below:

TABLE 1

| PWM1 value | PWM2 value | Voltage at output node 162 | Voltage at output node 172 | Vout |
|---|---|---|---|---|
| 1 | 1 | VDD | VDD | 0 |
| 1 | 0.5 | VDD | VDD/2 | VDD/2 |
| 1 | 0 | VDD | 0 | VDD |
| 0.5 | 1 | VDD/2 | VDD | −VDD/2 |
| 0.5 | 0.5 | VDD/2 | VDD/2 | VDD |
| 0.5 | 0 | VDD/2 | 0 | VDD/2 |
| 0 | 1 | 0 | VDD | −VDD |
| 0 | 0.5 | 0 | VDD/2 | −VDD/2 |
| 0 | 0 | 0 | 0 | 0 |

Thus, in comparison with the output stage 300 of FIG. 3, the output stage 460 supports an additional output signal level, in this example 0V.

Figure 7:
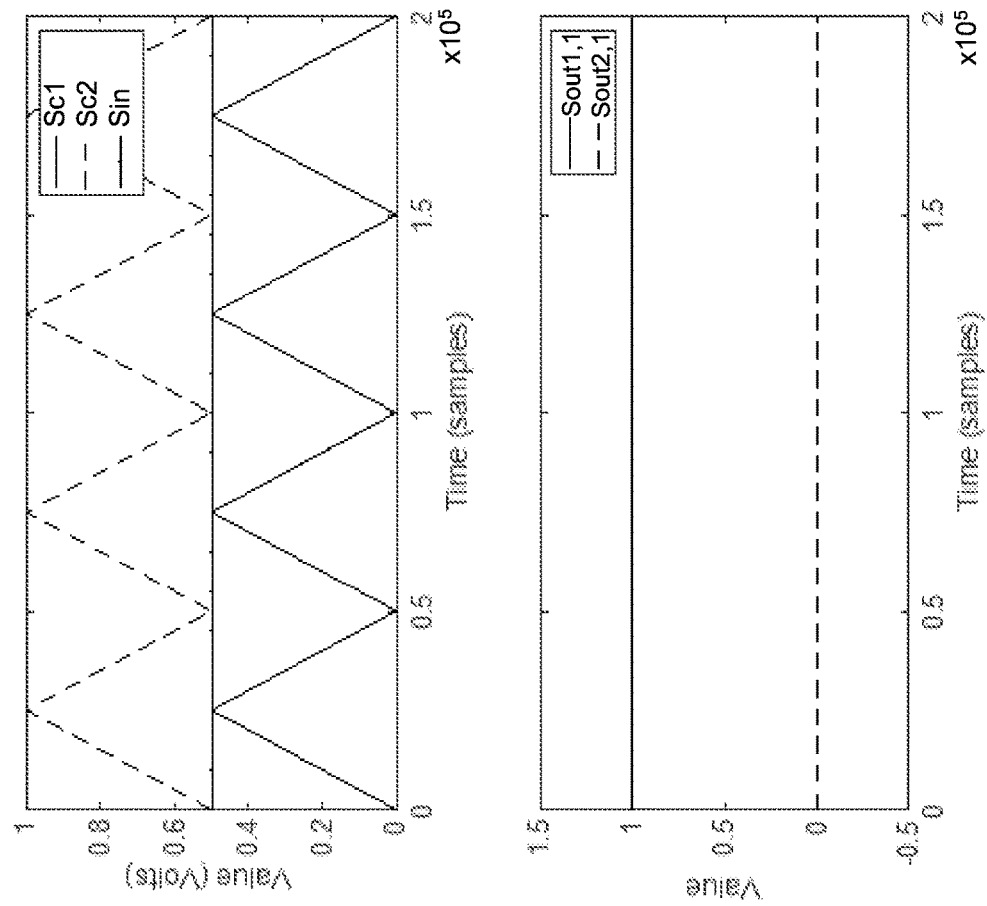
FIG. 7 illustrates modulated signals with 100% and 0% modulation index.

One feature of the dual carrier signal arrangement illustrated in FIG. 5 is that when the amplitude of the input signal Sin is equal to the amplitude offset between the first and second carrier signals Sc1, Sc2 (e.g. when the amplitude of the input signal Is 0.5 volts for the dual carrier arrangement of FIG. 5), the amplitude of the input signal Sin is always greater than or equal to that of the first carrier signal Sc1 and less than or equal to that of the second carrier signal Sc2. As a result of this, the first output signal Sout1,1 output by the first modulated signal generator circuitry 420 always takes a high signal level (i.e. the first output signal Sout1,1 has a 100% modulation index), and the second output signal Sout1,2 always takes a low signal level (i.e. the second output signal Sout1,2 has a 0% modulation index). This is illustrated in FIG. 7. As will be appreciated by those of ordinary skill in the art, a similar issue arises in the first and second output signals Sout2,1, Sout2,2 output by the second modulated signal generator circuitry 430.

Generally it is undesirable for any of the output signals Sout1,1, Sout1,2, Sout2,1, Sout2,2 to have a modulation index of either 100% or 0%, as this can lead to one or more of the modulated output signals PWM1, PWM2 also having a 100% or 0% modulation index, such that one or more of the switches of the output stage is either switched on or switched off for the duration of the period for which the modulation index is 100% or 0%, which can impede correct regulation of the amplifier circuitry 400, e.g. by adversely affecting the operation of a feedback loop of the amplifier circuitry 400.

To address this issue, the circuitry 400 can be configured such that at least one transition between signal levels (e.g. a low-to-high transition or a high-to-low signal transition) occurs in at least one of the control signals output by the modulator stage 410 in each signal period or cycle of at least one of the modulated output signals PWM1, PWM2.

In some examples the logic circuitry 450 may be configured to monitor the first and second modulated output signals PWM1, PWM2 to detect any signal period or cycle in which no transition (e.g. 0V to 0.5V, 0.5V to 1V, 1V to 0.5V, or 0.5V to 0V) occurs in either the first modulated output signal PWM1 or the second modulated output signal PWM2. In the case where neither the first modulated output signal PWM1 nor the second modulated output signal PWM2 includes a signal level transition in a particular signal period or cycle, the logic circuitry 450 may output a control signal to one of the switches 164, 166, 364, 174, 176, 374 to simulate the effect of a transition in one of the modulated output signals PWM1, PWM2, thus preventing a situation in which one or more of the switches 164, 166, 364, 174, 176, 374 is switched on or off for the duration of the period for which the modulation index is 100% or 0%.

Alternatively, the first and second carrier signals may be configured such that their peak-to-peak amplitude ranges partially overlap, as shown in FIG. 8a. When the first and second carrier signals Sc1, Sc2 are configured in this way an amplitude range of the first carrier signal Sc1 and an amplitude range of the second carrier signal Sc2 overlap with a mid-point of an amplitude range of the input signal Sin.

As can be seen in FIG. 8a, the first and second carrier signals Sc1, Sc2 are again equal in frequency and peak-to-peak amplitude and are aligned in time. However, in this example the amplitude of the first carrier signal Sc1 varies between 0.1 volts and 0.6 volts, whereas the amplitude of the second carrier signal Sc2 varies between 0.4 volts and 0.9 volts. Thus the peak-to-peak amplitude (0.5 V) of the first carrier signal Sc1 is still equal to the peak-to-peak amplitude (0.5 V) of the second carrier signal Sc2, but in this example the constant amplitude offset or level shift between the first and second carrier signals Sc1, Sc2 is 0.3 V. Thus in the illustrated example there is a partial overlap (in this example of 0.2 V) between the peak-to-peak amplitude range of the first carrier signal Sc1 and that of the second carrier signal Sc1. It will be appreciated, however, that the degree of overlap between the amplitude ranges of the first and second carrier signals can be selected according to the requirements of a particular application. An overlap of up to ten per cent of the peak-to-peak amplitude of the first and second carrier signals Sc1, Sc2 may be particularly suitable.

As will be appreciated, in the example illustrated in FIG. 8a in which the first and second carrier signals Sc1, Sc2 are level-shifted to effect a partial overlap between their respective amplitude ranges, a combined amplitude range of the first and second carrier signals Sc1, Sc2 may be less than the full-scale amplitude range of the input signal Sin. For example, in the example illustrated in FIG. 8a the combined amplitude range of the first and second carrier signals Sc1, Sc2 extends from +0.1V to +0.8V. If the full-scale amplitude range of the input signal Sin extended from 0V to +1V, the combined amplitude range of the first and second carrier signals Sc1, Sc2 would not cover the whole of the amplitude range of the input signal Sin, and thus the first and second output signals Sout1,1, Sout 1,2 would not accurately represent the input signal Sin, leading ultimately to distortion in the output signal Vout.

To address this problem the first and second carrier signals Sc1, Sc2 may be configured such that their combined amplitude range is equal to or greater than an expected full-scale amplitude range of the input signal Sin. An example of this is shown in FIG. 8b, in which the amplitude of the first carrier signal Sc1 varies between 0 volts and 0.6 volts, whereas the amplitude of the second carrier signal Sc2 varies between 0.4 volts and 1 volt. Thus in this example there is a constant amplitude offset or level shift of 0.4 volts between the first and second carrier signals Sc1, Sc2, and a partial overlap (in this example of 0.2V) between the peak-to-peak amplitude range of the first carrier signal Sc1 and that of the second carrier signal Sc1. The first and second carrier signals Sc1, Sc2 are again aligned in time and equal in frequency and peak-to-peak amplitude. However, in comparison to the example of FIG. 8a, in the example of FIG. 8b the amplitude of the first and second carrier signals Sc1, Sc2 is increased, to ensure that the combined amplitude range of the first and second carrier signals Sc1, Sc2 is equal to or greater than the expected full-scale amplitude range of the input signal Sin.

As will be appreciated by those of ordinary skill in the art, the overlapping carrier signals Sc1, Sc2 of FIG. 8b can be generated in a number of different ways. For example, the carrier signal generator 416 may be configured to generate the first and second carrier signals Sc1, Sc2 directly, with a desired combined amplitude range and degree of overlap. Alternatively, the carrier signal generator 416 may generate a single carrier signal and subsequently apply appropriate gain and level shifting to ensure that the combined amplitude range of the first and second carrier signals Sc1, Sc2 is equal to or greater than an expected full-scale amplitude range of the input signal Sin.

As a result of the partial overlap between the peak-to-peak amplitude ranges of the first and second carrier signals Sc1, Sc2, the situation illustrated in FIG. 7, in which the first output signal Sout1,1 has a modulation index of 100% and the second output signal Sout1,2 has a modulation index of 0%, does not arise, because there is at least one point for any input signal level at which the input signal Sin will cross one of the carrier signals Sc1, Sc2 in every period or cycle of the carrier signals Sc1, Sc2. Thus at least one of the modulated output signals PWM1, PWM2 will always contain at least one signal level transition per PWM signal period or cycle, for any input signal level.

Figure 9:
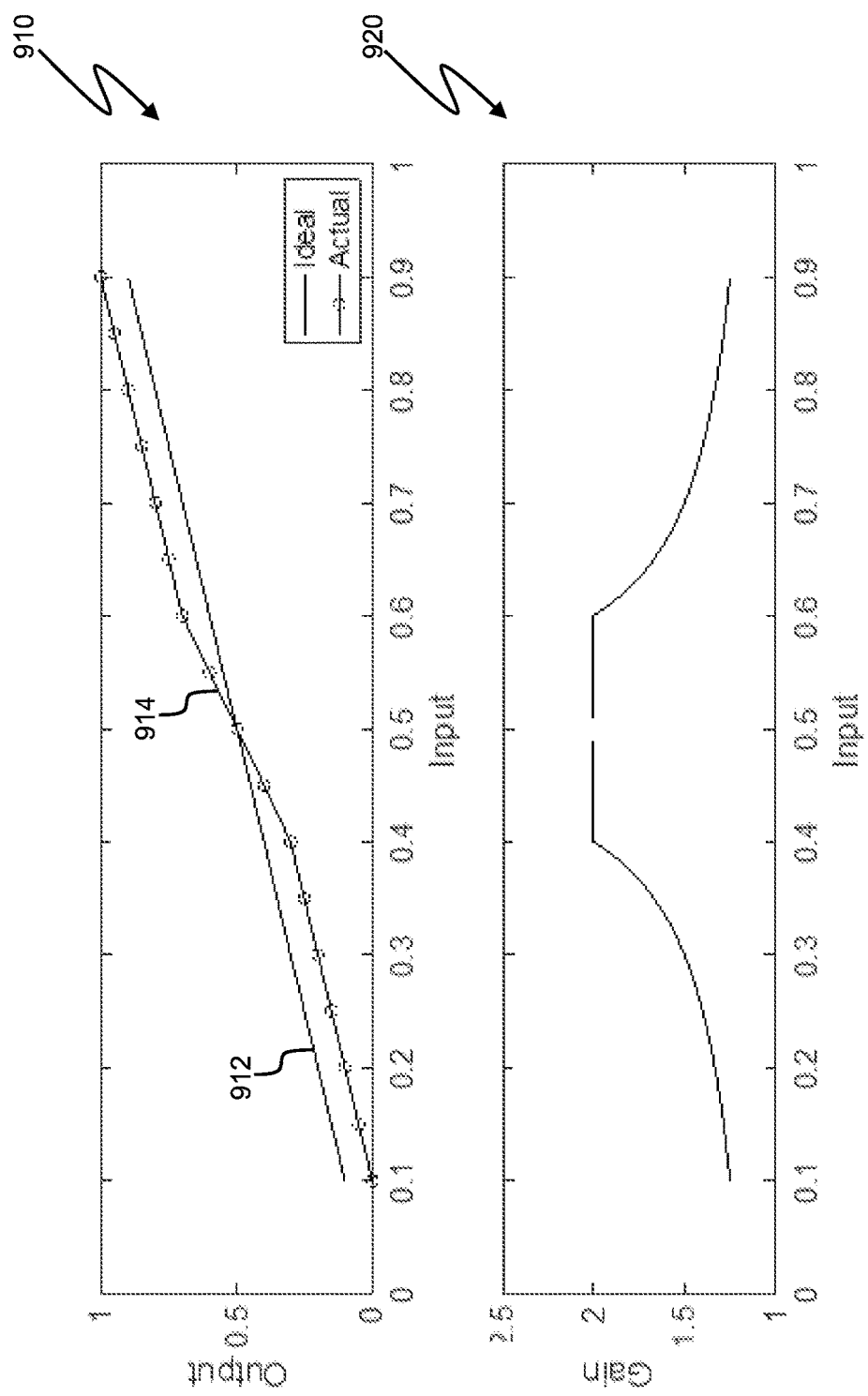
FIG. 9 illustrates distortion in an output signal arising from the use of overlapping carrier signals.

However, the partial overlap between the peak-to-peak amplitude ranges of the first and second carrier signals Sc1, Sc2 can give rise to distortion in the output signal Vout, as illustrated in FIG. 9.

The uppermost plot 910 of FIG. 9 shows the transfer function between the input signal and the output signal for amplifier circuitry that uses the partially overlapping carrier signals Sc1, Sc2 shown in FIG. 8b. In an ideal amplifier this transfer function would be linear, as shown by line 912. However, as can be seen from line 914, the actual transfer function is non-linear, as the gradient of the slope 914 increases for an input signal in the region of overlap between the first and second carrier signals Sc1, Sc2. The lowermost plot 920 of FIG. 9 shows that the gain of the amplifier is increased for an input signal in the region of overlap between the first and second carrier signals Sc1, Sc2.

It is desirable to improve the linearity of the amplifier circuitry 400 in order to minimise or at least reduce distortion in the output signal, and this can be achieved in a number of ways.

One approach, which is particularly suitable for amplifier circuitry 400 in which the carrier signal generator circuitry 416 comprises digital circuitry for generating the carrier signals Sc1, Sc2, is to modify or distort the carrier signals Sc1, Sc2 in the region of overlap to compensate, at least partially, for the distortion in the output signal. An alternative approach, which is particularly suitable for amplifier circuitry 400 in which the carrier signal generator circuitry 416 comprises analogue circuitry for generating the carrier signals Sc1, Sc2, is to modify or pre-distort the input signal Sin in order to compensate, at least partially, for the distortion in the output signal.

Figure 10:
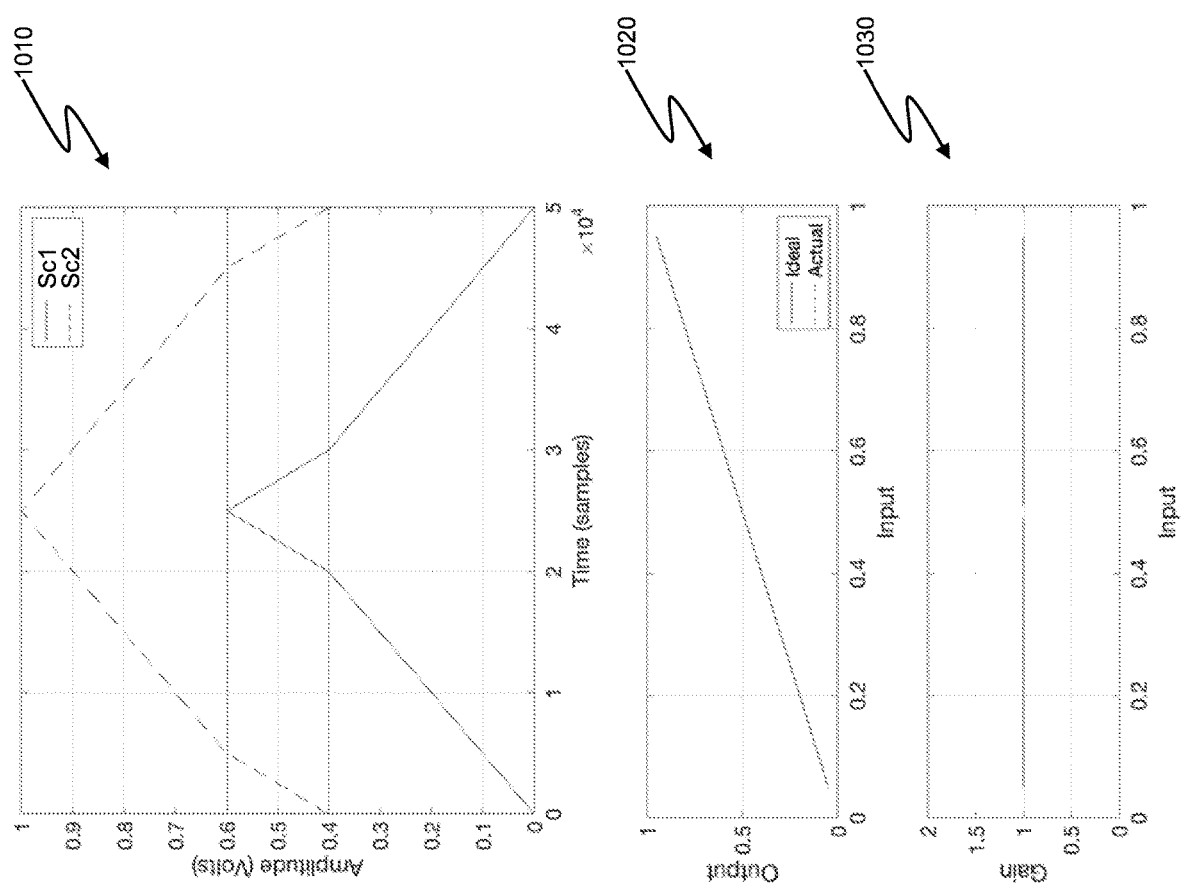
FIG. 10 shows example modified overlapping carrier signals and their effect on the output signal and transfer function of the amplifier circuitry.

FIG. 10 shows, in the uppermost plot 1010, carrier signals Sc1, Sc2 that are modified or distorted in the region of overlap between the carrier signals, in comparison to the carrier signals Sc1, Sc2 shown in FIG. 8, in order to improve the linearity of the amplifier circuitry 400 and thus reduce distortion in the output signal.

In the example illustrated in FIG. 10, the carrier signals Sc1, Sc2 are distorted triangle waveforms. In this example the distortion takes the form of non-uniform gradients (dAmplitude/dt) of the slopes of the waveforms, with the gradients being increased (doubled, in this example) in the region of overlap between the carrier signals.

The effect of this distortion is shown in the plots 1020, 1030. The middle plot 1020 of FIG. 10 shows the transfer function between the input signal and the output signal for amplifier circuitry that uses the partially overlapping carrier signals Sc1, Sc2 shown in plot 1010. As can be seen, the transfer function is now linear. The lowermost plot 1030 of FIG. 10 shows that the gain of the amplifier is substantially uniform across the input signal amplitude range.

As indicated above, modifying or distorting the first and second carrier signals Sc1, Sc2 to linearise the amplifier circuitry is an approach that is well-suited to circuitry 400 in which the carrier signal generator circuitry 416 comprises digital circuitry for generating the carrier signals Sc1, Sc2.

Figure 11:
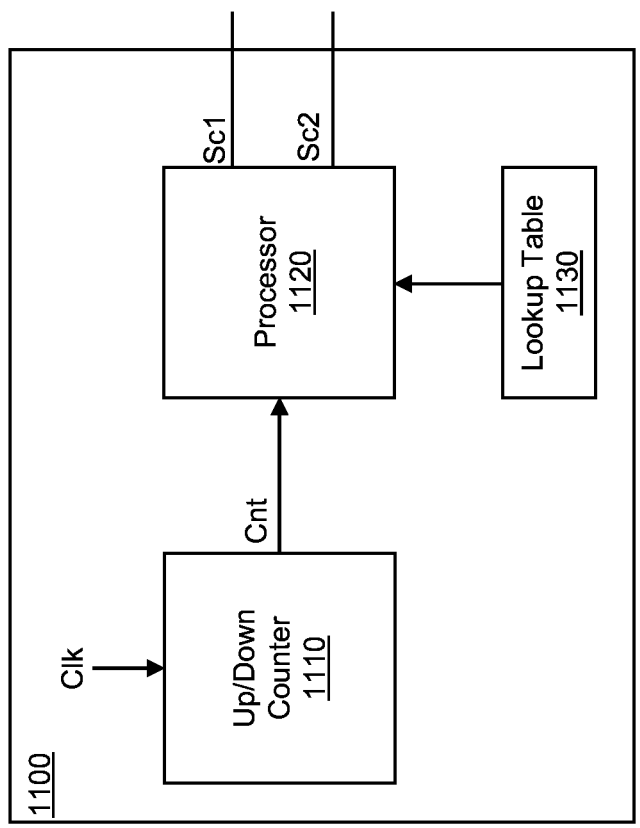
FIG. 11 is a schematic representation of example digital carrier signal generator circuitry for use in the modulator stage of the Class D amplifier circuitry of FIG. 4.

FIG. 11 is a schematic representation of example digital carrier signal generator circuitry 1100 for use as the carrier signal generator circuitry 416 of the Class D amplifier circuitry 400.

In the example illustrated in FIG. 11 the digital carrier signal generator circuitry comprises up/down counter circuitry 1110 configured to receive a clock signal Clk and to increment a count value on every clock pulse until a predetermined upper limit of the count value is reached, and then to decrement the count value on every clock pulse until a predetermined lower limit of the count value is reached. Thus the up/down counter circuitry 1110 is configured repeatedly to count up from a first predetermined count value (e.g. 0) to a second predetermined count value (e.g. 63, for a six-bit up/down counter) and back down to the first predefined count value, outputting signal Cnt that is indicative of the current count value. As will be appreciated, over the course of one up/down cycle of the up/down counter circuitry 1110, the value of the signal Cnt output by the up/down counter circuitry will approximate a cycle of a triangle wave signal, with the frequency of the triangle wave being dependent upon the frequency of the clock signal Clk.

The signal Cnt is output by the up/down counter circuitry 1110 to processing circuitry 1120, which uses the value represented by the signal Cnt as an index to a lookup table 1130 of compensated values for each of the first and second carrier signals Sc1, Sc2 for each count value of the up/down counter circuitry 1110. By programming the lookup table 1130 with appropriate values, first and second carrier signals Sc1, Sc2 in a form suitable for linearising the amplifier circuitry 400 (e.g. in the form of distorted triangle waves as shown in FIG. 10) can be generated and output by the processing circuitry 1120.

Alternatively, the processing circuitry 1120 may calculate or generate the compensated values for each of the first and second carrier signals Sc1, Sc2 on the fly, based on the values of the first and second carrier signals Sc1, Sc2. In this case the lookup table 1130 is not required.

The carrier signal generator circuitry 416 may alternatively comprise analogue circuitry configured to generate the first and second carrier signals Sc1, Sc2.

Figure 12:
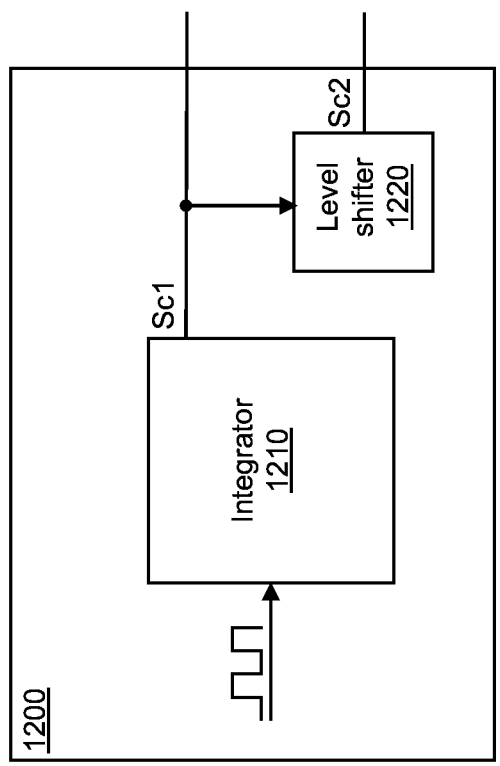
FIG. 12 is a schematic representation of example analogue carrier signal generator circuitry for use in the modulator stage of the Class D amplifier circuitry of FIG. 4.

FIG. 12 is a schematic representation of example analogue carrier signal generator circuitry for uses as the carrier signal generator circuitry 416.

In the example illustrated in FIG. 12 the analogue carrier signal generator circuitry 1200 comprises integrator circuitry 1210 configured to integrate a received square wave signal to generate a triangle wave signal for use as the first carrier signal Sc1, and level shifter circuitry 1220 configured to receive the first carrier signal Sc1 and to add a constant DC offset to generate the second carrier signal Sc2. The analogue carrier signal generator 1200 may be further configured to apply an appropriate gain (e.g. in the integrator circuitry 1210) to ensure that the combined amplitude range of the first and second carrier signals Sc1, Sc2 is equal to or greater than an expected full-scale amplitude range of the input signal Sin.

As mentioned above, one approach to improving the linearity of the amplifier circuitry 400 in order to minimise or at least reduce distortion in the output signal caused by the use of partially overlapping carrier signals Sc1, Sc2 is to modify or pre-distort the input signal Sin in order to compensate, at least partially, for the distortion.

Figure 13:
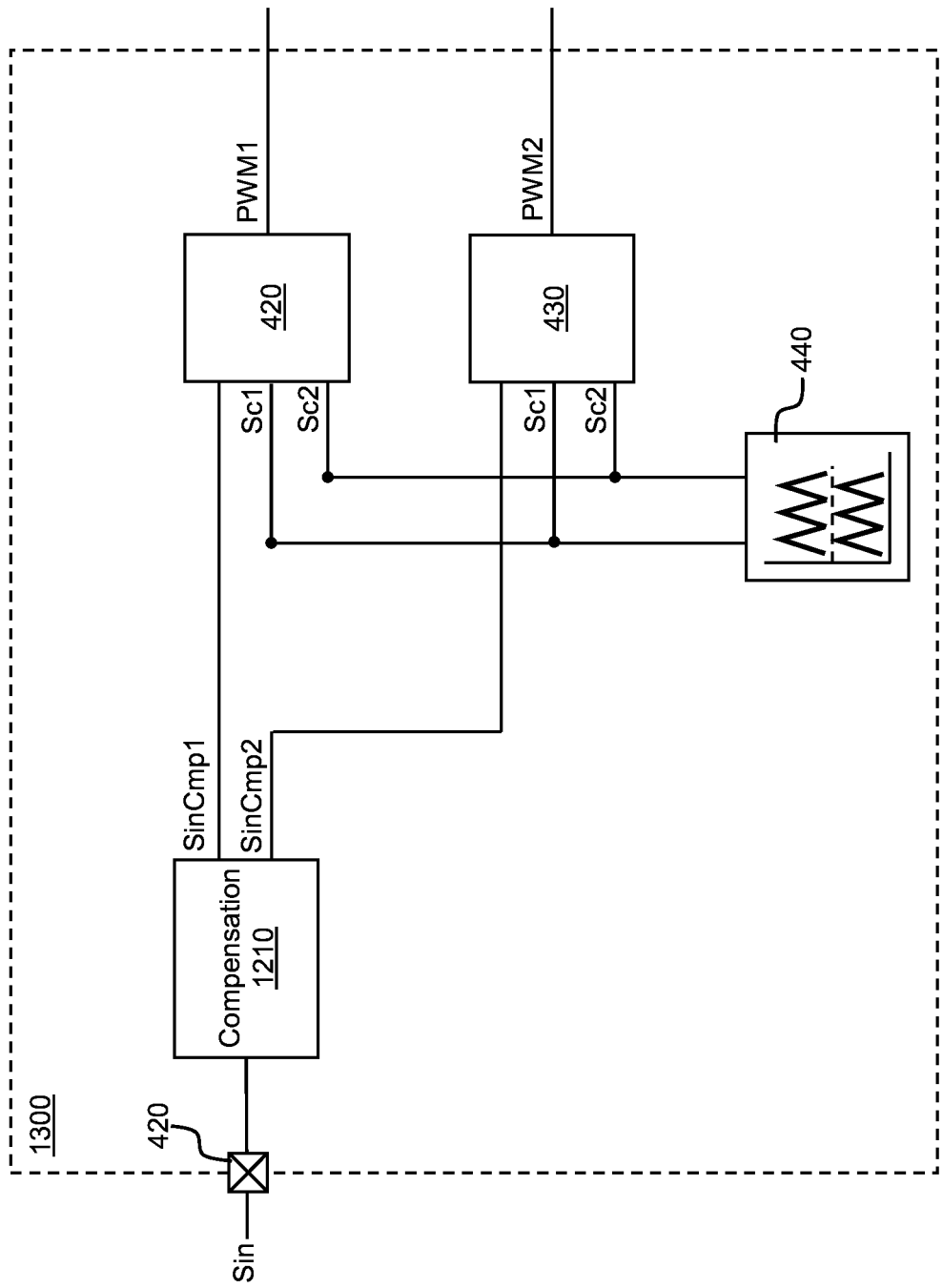
FIG. 13 is a schematic representation of example modulator circuitry which includes pre-distortion circuitry.

FIG. 13 is a schematic representation of example modulator circuitry 1200 which includes compensation circuitry 1210 for modifying or pre-distorting the input signal Sin to compensate, at least partially, for distortion in the output signal of the amplifier circuitry 400. The modulator circuitry 1200 has a number of elements in common with the modulator circuitry 410 shown in FIG. 4. Such common elements are denoted by common reference numerals and will not be described in detail here.

As shown in FIG. 13, the compensation circuitry 1210 is configured to receive the input signal Sin and to output first and second compensated (e.g. pre-distorted) signals Sin-Cmp1, SinCmp2 to the first and second modulated signal generator circuitry 420, 430. For example, the first compensated signal SinCmp1 may be generated by applying a first pre-distortion function to the input signal Sin, while the second compensated signal SinCmp2 may be generated by applying a second pre-distortion function (which is different to the first pre-distortion function) to an inverted version $\overline{Sin}$ of the input signal Sin.

The compensation circuitry 1210 may be configured to apply a polynomial transfer function G to apply an inverse polynomial for the fixed non-linearity in the output of the amplifier circuitry 400. However, as the distortion in the output signal is related to the crossing of the input signal with the carrier signals, it is not well-suited for compensation by applying a polynomial transfer function, and thus although applying a polynomial transfer function may improve linearity to some extent, significant non-linearity may remain for input signal levels in the region of overlap between the carrier signals.

In an alternative approach the compensation circuitry 1210 may be configured to apply a machine learning function (e.g. a single layer fully connected neural network with a tanh activation function) to modify the input signal Sin. Although this approach is generally more effective than applying a polynomial transfer function, it may still leave non-linearity for input signal levels in the region of overlap between the carrier signals.

In a further alternative approach the compensation circuitry 1210 may be configured to apply an input signal level dependent compensation function G(x).

For example, the compensation function may be of the form:

$$G(x) = \begin{cases} \frac{1}{2}, & |x - V_{mid}| < \text{offset} \\ 1, & \text{otherwise} \end{cases}$$

(where x is the input signal level, Vmid is the mid-point of the combined peak-to-peak amplitude range of the first and second carrier signals Sc1, Sc2, and offset is the magnitude of the overlap between the first and second carrier signals Sc1, Sc2).

Figure 14:
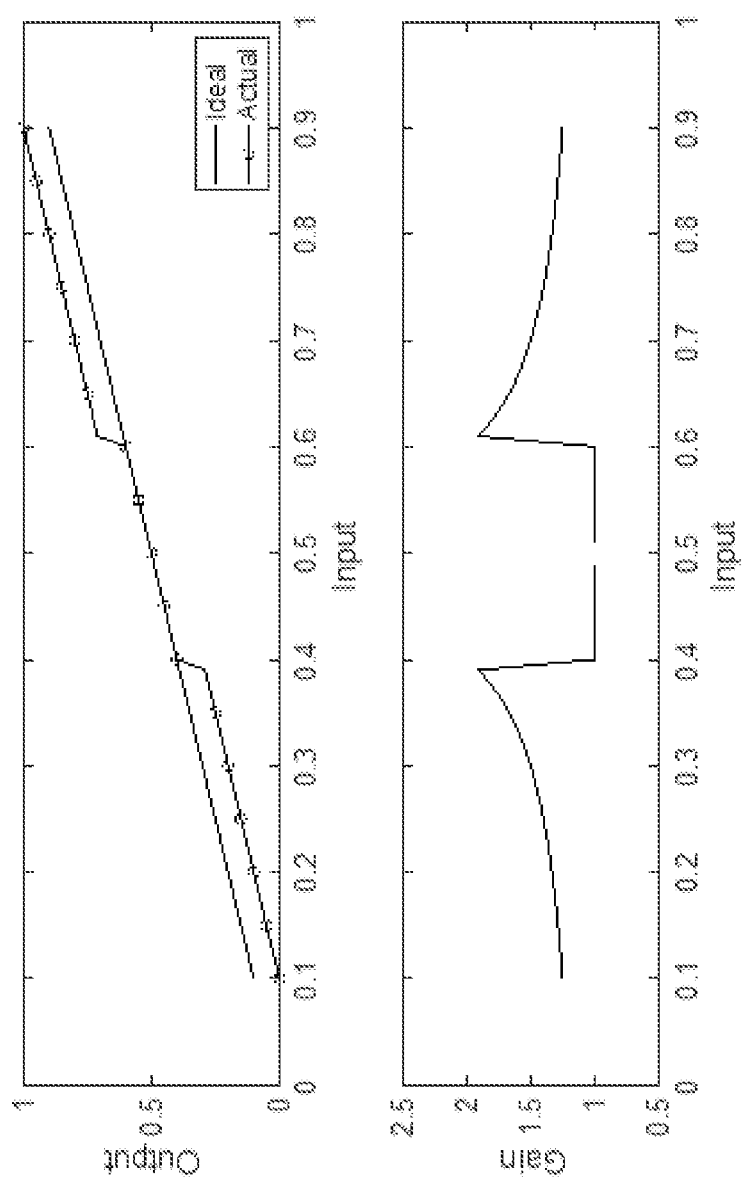
FIG. 14 illustrates the effect of the pre-distortion circuitry of the modulator circuitry of FIG. 13.

A compensation function of this form provides linearity and uniform gain at small input signal levels (which is desirable for audio signals), as shown in the plots of FIG. 14. Thus distortion only occurs at large signal levels. In a closed loop amplifier design the loop gain will suppress such distortion, and thus adding an appropriate feedback loop to the amplifier circuitry 400 can further improve linearity for input signal levels that are outside of the region of overlap between the carrier signals where the compensation circuitry 1210 implements a compensation function G(x) of the kind described above.

An alternative is to apply a polynomial compensation function for input signal levels outside of the region of overlap between the first and second carrier signals, e.g. a compensation function of the form:

$$G(x) = \begin{cases} \frac{1}{2}, & |x - V_{mid}| < \text{offset} \\ k_0 + k_1 x + K_2 x^2 + \ldots, & \text{otherwise} \end{cases}$$

Such a compensation function provides linearity and uniform gain at small input signal levels (e.g. input signal levels that are within the region of overlap between the first and second carrier signals) and reduces distortion for input signal levels outside the region of overlap between the first and second carrier signals.

Alternatively, instead of applying a polynomial function, a neural network could be used to distort or modify input signals at levels outside of the region of overlap between the carrier signals in order to compensate, at least partially, for the distortion in the output signal caused by the amplifier gain at such input signal levels.

Where the input signal Sin is a digital input signal, the compensation circuitry 1210 may comprise digital pre-distortion circuitry for modifying or pre-distorting the input signal Sin to compensate, at least partially, for distortion in the output signal of the amplifier circuitry 400. The pre-distortion circuitry may comprise, for example, a lookup table containing compensated values for the input signal Sin in the region of overlap between the first and second carrier signals Sc1, Sc2. Thus, the value of the digital input signal Sin may be used as an index to the lookup table, with the pre-distortion circuitry outputting the corresponding compensated input signal value to the first modulated signal generator circuitry 420 and to the inverter circuitry 414. Alternatively, the pre-distortion circuitry may calculate or generate a compensated input signal value on the fly, based on the value of the input signal Sin. In this case the lookup table is not required. Such digital pre-distortion effectively applies an input signal level dependent compensation function to the digital input signal Sin to generate a compensated input signal that compensates, at least partially, for the distortion in the output signal caused by the amplifier gain for input signal levels in the region of overlap between the first and second carrier signals Sc1, Sc2.

In some examples, the amplifier circuitry 400 may be configured to switch, based on a parameter or characteristic of the input signal Sin, between a multi-carrier mode in which a plurality (e.g. two) of carrier signals are used to generate the modulated output signals PWM1, PWM2 and a single carrier mode in which only one carrier signal is used to generate the modulated output signals PWM1, PWM2.

Figure 1:
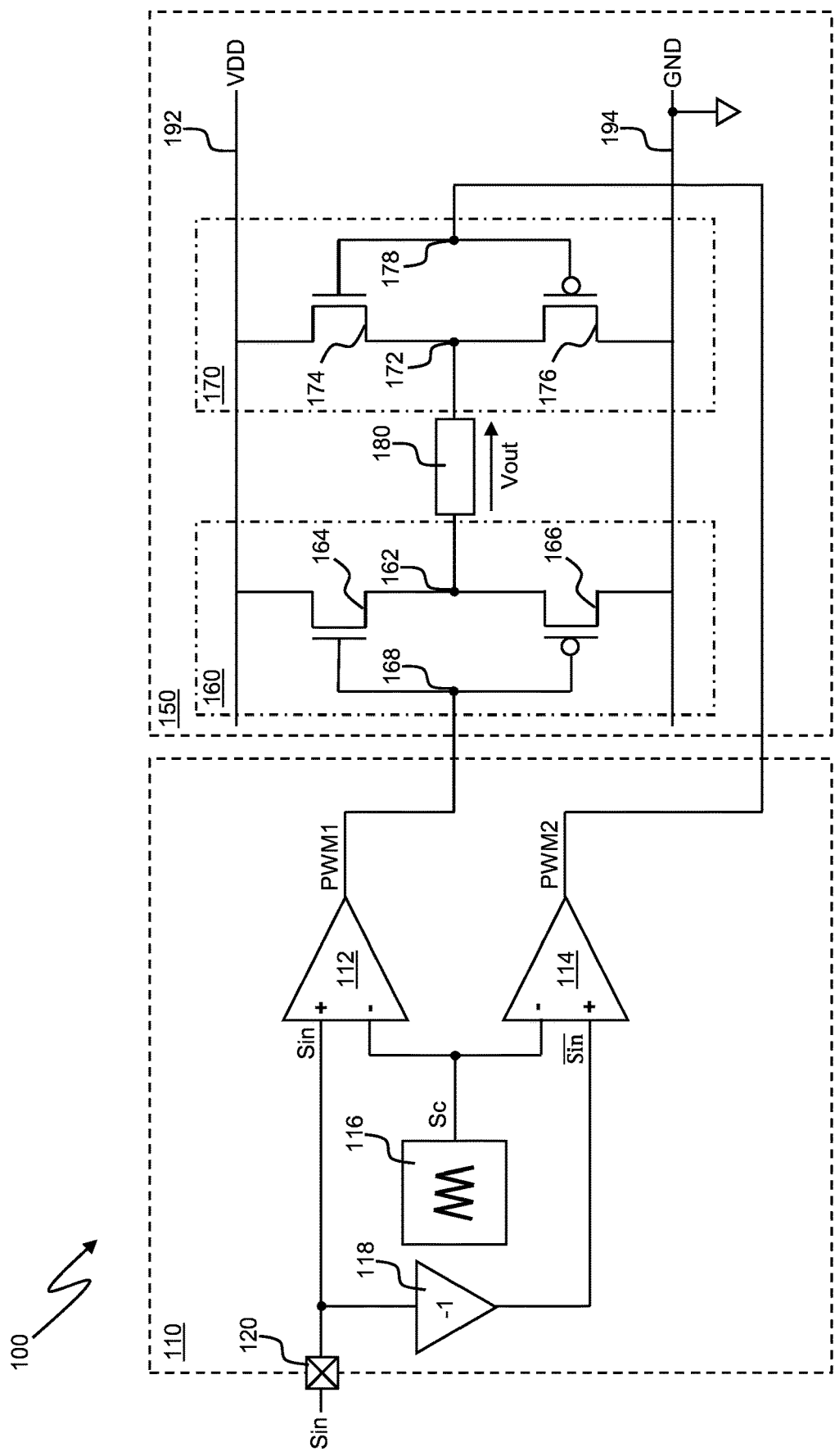
FIG. 1 is a schematic diagram illustrating Class D amplifier circuitry comprising a modulator stage and an output stage.
Figure 15:
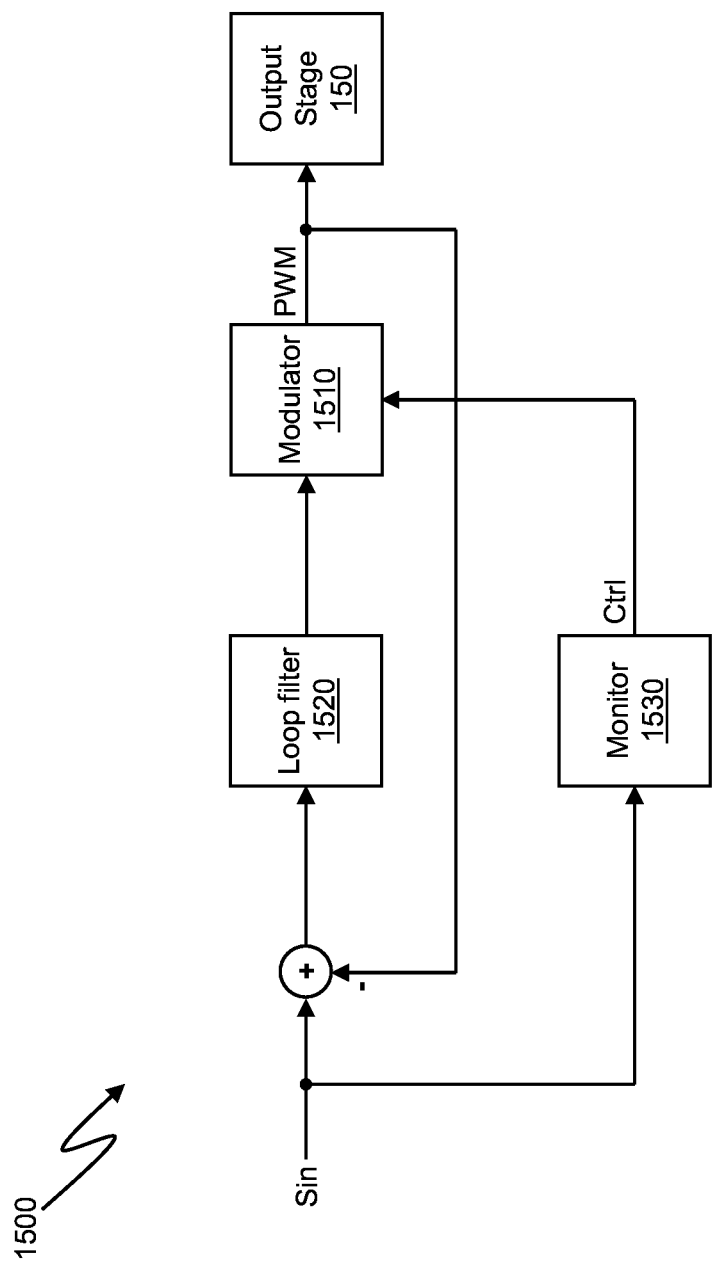
FIG. 15 is a schematic representation of Class D amplifier circuitry that is switchable between a multi-carrier mode and a single carrier mode of operation.

FIG. 15 is a schematic representation of Class D amplifier circuitry that is switchable between a multi-carrier mode and a single carrier mode of operation. The circuitry, shown generally at 1500 in FIG. 15, includes modulator circuitry 1510 which is operable in either a multi-carrier mode or a single carrier mode. The modulator circuitry 1510 receives an input signal Sin via a loop filter 1520 and outputs PWM output signals to an output stage, which may be, for example, an output stage 150 of the kind described above with reference to FIG. 1.

The circuitry 1500 further includes signal monitor circuitry 1530 configured to receive the input signal Sin and to output a control signal Ctrl to control the mode of operation of the amplifier circuitry 1500 based on a parameter or characteristic of the input signal. For example, the monitor circuitry 1530 may be configured to monitor a parameter such as an envelope, signal level (e.g. amplitude or volume) of the input signal Sin and output a control signal to switch from multi-carrier mode to single-carrier mode when the monitored parameter meets a predefined threshold.

Thus, for input signal levels below the predetermined threshold the modulator circuitry 1520 may operate in multi-carrier mode to support one or more additional intermediate output voltage levels in the output stage 460 (as discussed above), whereas for input signal levels that meet or exceed the threshold the modulator circuitry 1520 operates in single carrier mode to provide fewer (e.g. +/−VDD or +VDD, 0V, −VDD) output voltage levels.

By controlling the operating mode of the modulator circuitry 1520 in this way the power consumption of the Class D amplifier circuitry 1500 can be reduced (in comparison to the Class D amplifier circuitry 100 of FIG. 1) for low input signal levels through the use of the additional intermediate output voltage level(s). At higher input signal levels the distortion that may arise in the output signal as a result of the use of multiple carriers can be avoided, as the modulator circuitry 1520 uses only a single carrier to generate the PWM output signals that drive the first and second half-bridges 160, 170 of the output stage 150.

The modulator circuitry 1520 may be similar to the modulator circuitry 410 described above with reference to FIG. 4, and may comprise either digital circuitry (as described above with reference to FIG. 11) or analogue circuitry (as described above with reference to FIG. 12) for generating the carrier signals Sc1, Sc2.

In response to a control signal Ctrl indicative that the modulator circuitry 1520 should operate in multi-carrier mode, the modulator circuitry 1520 can operate as described above, generating first and second modulated output signals PWM1, PWM2 based on first and second carrier signals Sc1, Sc2 that are level-shifted relative to one another. The first and second carrier signals Sc1, Sc2 in some examples may have partially overlapping peak-to-peak amplitude ranges, as described above with reference to FIG. 8, in which case the carrier signals Sc1, Sc2 and/or the input signal may be modified or distorted to compensate, at least partially, for distortion of the output signal as described above with reference to FIGS. 9 to 13. Alternatively there may be no overlap between the peak-to-peak amplitude ranges of the offset carrier signals Sc1, Sc2, as described above with reference to FIG. 7.

In response to a control signal Ctrl indicative that the modulator circuitry 1520 should operate in single carrier mode, the carrier signal generator circuitry 440 is operative to output a single carrier signal Sc (e.g. the first carrier signal Sc1) to both the first modulated signal generator circuitry 420 and the second modulated signal generator circuitry 430. The second comparator circuitry 424, 434 of each of the first and second modulated signal generator circuitry 420, 430 may be disabled and the gain of the amplifier circuitry 428, 438 may be increased to 1, such that the first and second modulated signal generator circuitry 420 can generate and output the first and second modulated output signals PWM1, PWM2 in the manner described above with reference to FIG. 1.

In response to a further control signal Ctrl indicative that the modulator circuitry 1520 should operate in the multi-carrier mode, the carrier signal generator circuitry 440 may resume outputting the second carrier signal Sc2, the first and second comparator circuitry 424, 434 of each of the first and second modulated signal generator circuitry 420, 430 may be re-enabled, and the gain of the amplifier circuitry 428, 438 may be reduced to ½, such that the first and second modulated signal generator circuitry 420 can resume generating the first and second modulated output signals PWM1, PWM2 as described above with reference to FIG. 4.

Alternatively, in response to a control signal Ctrl indicative that the modulator circuitry 1520 should operate in single carrier mode, the carrier signal generator 440 may reduce the amplitude offset between the first and second carrier signals Sc1, Sc2 to zero, e.g. by level-shifting and/or adjusting the amplitude of one or both of the carrier signals so that they coincide (e.g. overlap completely) with each other such that the first and second carrier signals Sc1, Sc2 are substantially identical to one another. The second comparator circuitry 424 of the first modulated output signal generator circuitry 420 and the first comparator circuitry 432 of the second modulated output signal generator circuitry 420 may be disabled, and the gain of the amplifier circuitry 428, 438 may be increased to 1, such that the first and second modulated signal generator circuitry 420 can generate and output first and second modulated output signals PWM1, PWM2 as described above with reference to FIG. 1. In response to a further control signal Ctrl indicative that the modulator circuitry 1520 should operate in the multi-carrier mode, the carrier signal generator circuitry 40 may increase the amplitude offset between the first and second carrier signals, and/or adjust the amplitude of one or both of the carrier signals such that there is no overlap, or only partial overlap, in their peak-to-peak amplitude ranges. The second comparator circuitry 424 of the first modulated output signal generator circuitry 420 and the first comparator circuitry 432 of the second modulated output signal generator circuitry 420 may be re-enabled, and the gain of the amplifier circuitry 428, 438 may be reduced to ½, such that the first and second modulated signal generator circuitry 420 can resume generating the first and second modulated output signals PWM1, PWM2 as described above with reference to FIG. 4. Such adjustments to the amplitude offset and/or the amplitude of the first and/or second carrier signals Sc1, Sc2 may be performed over a period of time to ensure a smooth transition between multi-carrier and single carrier operation and vice versa.

Figure 16:
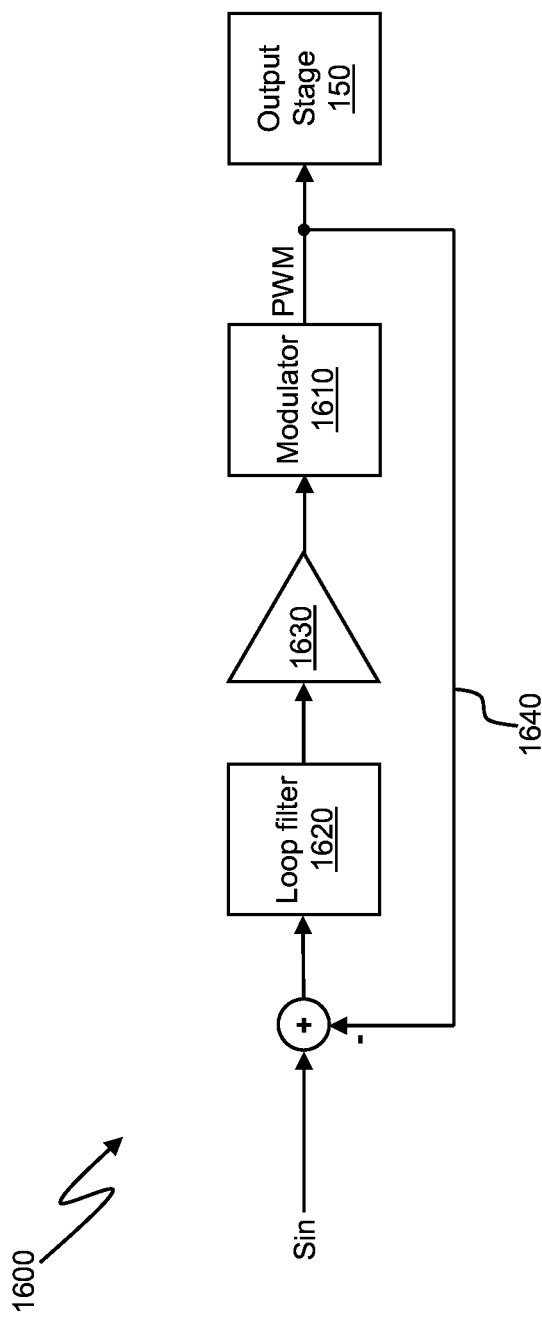
FIG. 16 is a schematic representation of a further example of Class D amplifier circuitry.

FIG. 16 is a schematic representation of a further example of Class D amplifier circuitry, in which loop gain is used to suppress gain in the Class D amplifier circuitry at input signal levels outside of the region of overlap between the first and second carrier signals Sc1, Sc2 that may arise as a result of a compensation function that is applied to the input signal Sin.

The circuitry, shown generally at 1600 in FIG. 16 includes a multi-carrier modulation stage 1610 configured to generate modulated output signals PWM for driving the first and second half-bridges 160, 170 of output stage circuitry 150.

Loop filter circuitry 1620 receives an input signal Sin and outputs a filtered version of the input signal to pre-distortion circuitry 1630, which is operative to apply a compensation function G to the received signal to compensate, at least partially, for distortion in the output signal output by the output stage 150 that may arise as a result of using partially overlapping carrier signals to generate the PWM output signals. A compensated or pre-distorted version of the input signal is therefore output by the pre-distortion circuitry 1630 to the modulator circuitry 1630, as described above with reference to FIG. 13.

Figure 17:
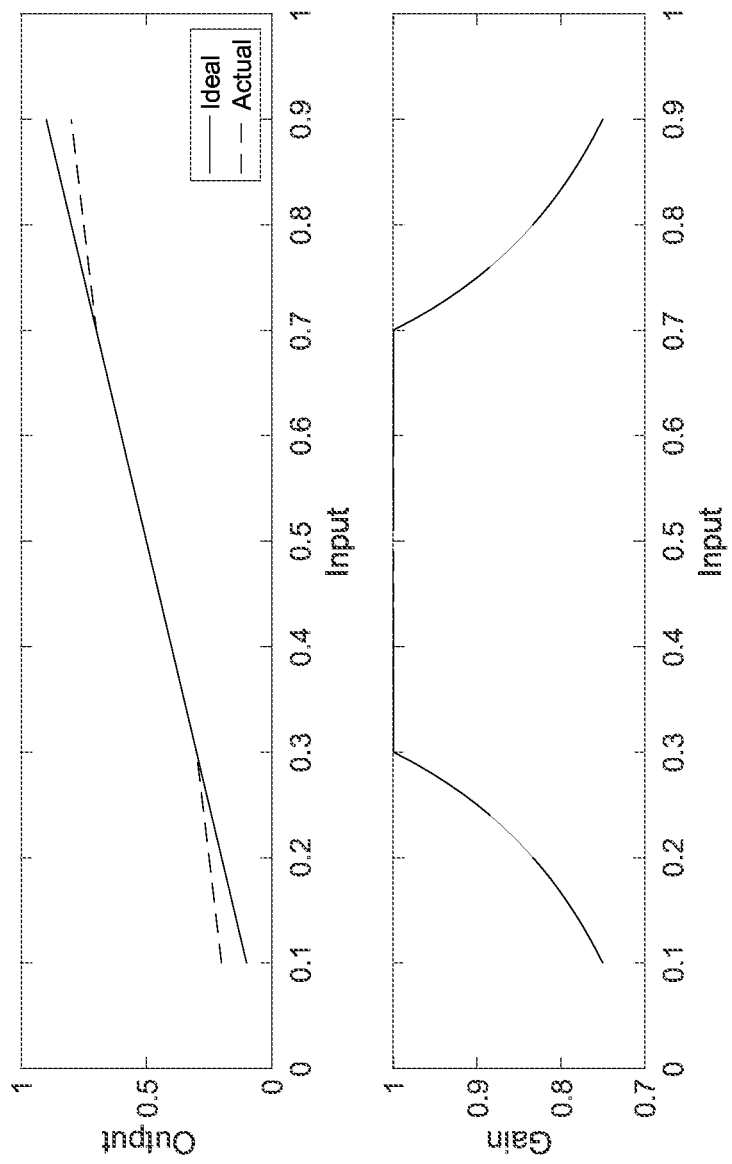
FIG. 17 illustrates the effect of the loop gain in the Class D amplifier circuitry of FIG. 16.

A feedback loop 1640 is provided between the outputs of the modulator circuitry 1610 and the input of the loop filter 1620 such that a portion of the output PWM signals can be fed back to the pre-distortion circuitry 1630 to suppress excess gain at input signal levels outside of the region of overlap between the first and second carrier signals Sc1, Sc2, as illustrated in the plots of FIG. 17.

As will be appreciated from the foregoing discussion, the use of multiple carrier signals in the modulator stage of the Class D amplifier circuitry can help to reduce the power consumption of the Class D amplifier circuitry at low input signal levels, by supporting one or more additional intermediate output voltage levels in the output stage of the Class D amplifier circuitry. The input signal may be, for example, an audio signal.

Figure 2:
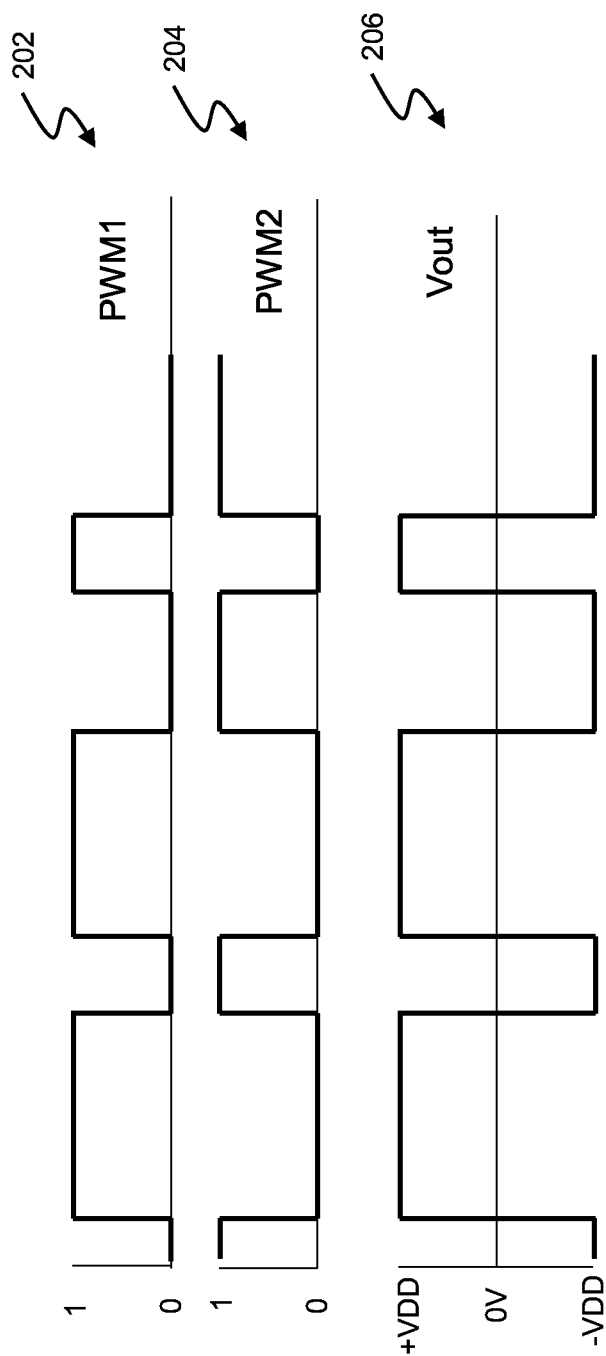
FIG. 2 shows example waveforms of signals in the Class D amplifier circuitry of FIG. 1.

The Class D amplifier circuitry of the present disclosure avoids the problems of audible artefacts associated with multi-rail Class D amplifiers of the kind illustrated in FIG. 2, as the control signals required to switch between first and second supply rails to support intermediate output voltage levels are provided by the modulator stage, rather than requiring additional circuitry to monitor, e.g., an input signal level or envelope and force a switch between first and second supply rails of the output stage based on a comparison of the input signal to a threshold.

Although in the examples described above two carrier signals are used, it will be appreciated by those of ordinary skill in the art that more than two carriers, each level shifted with respect to the others, could equally be used to generated pulse width modulated output signals for driving the output stage of Class D amplifier circuitry according to the principles of the present disclosure.

The examples described above and shown in the accompanying Figures use a full-bridge output stage to drive a bridge-tied load with a differential output signal, but it will be appreciated by those of ordinary skill in the art that the principles and techniques of the present disclosure are equally applicable to single-ended output stages.

The Class D amplifier circuitry 400 may be implemented in integrated circuitry, e.g. as a single integrated circuit implementing the modulator stage 410/1300 and the output stage 420, or as separate integrated circuits that implement the modulator stage 410/1300 and the output stage 420 respectively.

In the foregoing description the modulator stage 410/1300 has been described in the context of a Class D amplifier. However, the multi-carrier modulation circuitry and techniques described above are equally suitable for use in DC-DC converter circuitry. Thus the present disclosure extends to DC-DC converter circuitry comprising multi-carrier modulator circuitry of the kind described above.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product. In some instances the device could be a gaming device such as a games console, or a virtual reality (VR) or augmented reality (AR) device such as a VR or AR headset, spectacles or the like.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array).

Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Class D amplifier circuitry comprising:
    modulator circuitry; and
    output stage circuitry,
    wherein the modulator circuitry is configured to:
        receive an input signal and first and second carrier signals, wherein the second carrier signal is offset in amplitude with respect to the first carrier signal;
        generate first and second modulated output signals, each of the first and second modulated output signals being based on the input signal and the first and second carrier signals; and
        generate a plurality of control signals for the output stage circuitry per signal period of the modulated output signals, wherein the plurality of control signals are based on the first and second modulated output signals, and wherein at least one of the plurality of control signals per signal period comprises a signal level transition.

2. Class D amplifier circuitry according to claim 1, wherein an amplitude range of the first carrier signal and an amplitude range of the second carrier signal partially overlap such that at least one of the first and second modulated output signals comprises at least one signal level transition per signal period.

3. Class D amplifier circuitry according to claim 2, wherein the first and second carrier signals are configured such that a combined amplitude range of the first and second carrier signals is equal to or greater than an expected full-scale amplitude range of the input signal.

4. Class D amplifier circuitry according to claim 2, wherein the Class D amplifier circuitry further comprises compensation circuitry configured to compensate, at least partially, for distortion in an output signal of the Class D amplifier circuitry that arises as a result of the overlap in the amplitude ranges of the first and second carrier signals.

5. Class D amplifier circuitry according to claim 4, wherein the compensation circuitry is configured to modify the first and second carrier signals.

6. Class D amplifier circuitry according to claim 5, wherein the modulator circuitry comprises digital carrier signal generator circuitry, and wherein the compensation circuitry comprises processing circuitry configured to adjust a value of the first and second carrier signals in a region of overlap of the first and second carrier signals.

7. Class D amplifier circuitry according to claim 5, wherein the compensation circuitry comprises a lookup table containing predefined adjusted values for the first and second carrier signals in the region of overlap.

8. Class D amplifier circuitry according to claim 5, wherein the modulator comprises up/down counter circuitry configured to count from a first predetermined count value to a second predetermined count value and from the second predetermined count value to the first predetermined count value in synchronisation with a clock signal.

9. Class D amplifier circuitry according to claim 4, wherein the compensation circuitry is configured to modify the input signal.

10. Class D amplifier circuitry according to claim 9, wherein the compensation circuitry comprises predistortion circuitry configured to apply a compensation function to modify the input signal and to output a modified version of the input signal for use in generating the first and second modulated output signals.

11. Class D amplifier circuitry according to claim 10, wherein the compensation function comprises one or more of:
    a polynomial transfer function;
    a machine learning function; and
    an input signal level dependent compensation function.

12. Class D amplifier circuitry according to claim 10, wherein the compensation function comprises a first fixed gain for input signal levels within a region of overlap of the first and second carrier signals and a second fixed gain for input signal levels outside the region of overlap.

13. Class D amplifier circuitry according to claim 10, wherein the compensation function comprises a fixed gain for input signal levels within a region of overlap of the first and second carrier signals and a polynomial transfer function or machine learning function for input signal levels outside the region of overlap.

14. Class D amplifier circuitry according to claim 10, further comprising a feedback loop operative to feed a portion of a modulated output signal output by the modulator circuitry to an input of the predistortion circuitry.

15. Class D amplifier circuitry according to claim 1, wherein the modulator circuitry is operable in:
    a multi-carrier mode in which the first and second carrier signals are used to generate the first and second modulated output signals; and
    a single-carrier mode in which a single carrier signal is used to generate the first and second modulated output signals.

16. Class D amplifier circuitry according to claim 15, further comprising signal monitor circuitry configured to monitor a parameter of the input signal and to output a mode control signal to control the operating mode of the modulator circuitry based on the monitored parameter of the input signal.

17. Class D amplifier circuitry according to claim 16, wherein the monitored parameter comprises one or more of an envelope, a signal level or a signal volume of the input signal.

18. Class D amplifier circuitry according to claim 2, wherein the amplitude ranges of the first and second carrier signals overlap by up to ten per cent of a peak-to-peak amplitude of the first and second carrier signals.

19. Class D amplifier circuitry according to claim 1, wherein the modulator circuitry is configured to insert a signal level transition into the at least one of the plurality of control signals if, for a corresponding period of the first and second modulated output signals, neither the first modulated output signal nor the second modulated output signal contains a signal level transition.

20. Class D amplifier circuitry comprising:
modulator circuitry operable in a single carrier operating mode and a multi-carrier operating mode, the modulator circuitry being configured to receive an input signal and to output a modulated output signal based on the input signal; and
signal monitor circuitry operative to monitor a parameter of the input signal and to output a mode control signal to control the operating mode of the modulator circuitry based on the monitored parameter of the input signal.

21. Pulse width modulator circuitry comprising:
first modulated signal generator circuitry configured to receive first and second carrier signals and a first modulating signal derived from an input signal and to generate a first pulse width modulated output signal based on the first and second carrier signals and the first modulating signal; and
second modulated signal generator circuitry configured to receive the first and second carrier signals and a second modulating signal derived from the input signal and to generate a second pulse width modulated output signal based on the first and second carrier signals and the second modulating signal,
wherein the second carrier signal is offset in amplitude with respect to the first carrier signal, and wherein an amplitude range of the first carrier signal and an amplitude range of the second carrier signal partially overlap.

22. DC-DC converter circuitry comprising:
modulator circuitry configured to:
receive an input signal and first and second carrier signals, wherein the second carrier signal is offset in amplitude with respect to the first carrier signal;
generate first and second modulated output signals, each of the first and second modulated output signals being based on the input signal and the first and second carrier signals; and
generate a plurality of control signals per signal period of the modulated output signals, wherein the plurality of control signals are based on the first and second modulated output signals, and wherein at least one of the plurality of control signals per signal period comprises a signal level transition.

23. Class D amplifier circuitry comprising:
modulator circuitry configured to:
receive an input signal and first and second carrier signals, wherein the second carrier signal is offset in amplitude with respect to the first carrier signal; and
generate first and second modulated output signals,
wherein the first modulated output signal is based on the input signal and the first carrier signal and the second modulated output signal is based on the input signal and the second carrier signal,
generate a plurality of control signals for the output stage circuitry per signal period of the modulated output signals, wherein the plurality of control signals are based on the first and second modulated output signals, and wherein at least one of the plurality of control signals per signal period comprises a signal level transition.

24. An integrated circuit comprising circuitry according to claim 1.

25. An electronic device comprising circuitry according to claim 1.

26. An electronic device according to claim 25, wherein the electronic device comprises a mobile telephone, a tablet or laptop computer, a wearable device, a gaming device, a virtual reality or augmented reality device.

* * * * *

UNITED STATES PATENT AND TRADEMARK OFFICE
CERTIFICATE OF CORRECTION

PATENT NO. : 11,588,452 B2
APPLICATION NO. : 17/186741
DATED : February 21, 2023
INVENTOR(S) : Lesso et al.

It is certified that error appears in the above-identified patent and that said Letters Patent is hereby corrected as shown below:

In the Claims

1. In Column 24, Line 4, in Claim 7, delete "the region of overlap." and insert -- a region of the overlap. --, therefor.

2. In Column 24, Line 39, in Claim 14, delete "a modulated output signal" and insert -- the modulated output signal --, therefor.

3. In Column 25, Line 7, in Claim 20, delete "a modulated output signal" and insert -- the modulated output signal --, therefor.

4. In Column 26, Line 31, in Claim 26, delete "An electronic device" and insert -- The electronic device --, therefor.

Signed and Sealed this
Thirteenth Day of June, 2023

Katherine Kelly Vidal
*Director of the United States Patent and Trademark Office*